United States Patent
Kim et al.

(10) Patent No.: US 8,619,423 B2
(45) Date of Patent: Dec. 31, 2013

(54) FAN MODULE HAVING DUST-COLLECTING FUNCTION AND DUST-COLLECTING UNIT FOR THE SAME

(75) Inventors: Cheol-Hyun Kim, Seoul (KR); Sung-Chul Park, Seoul (KR)

(73) Assignee: V.L. System Co., Ltd., Seoul (KR)

( * ) Notice: Subject to any disclaimer, the term of this patent is extended or adjusted under 35 U.S.C. 154(b) by 175 days.

(21) Appl. No.: 13/384,741

(22) PCT Filed: Jul. 8, 2010

(86) PCT No.: PCT/KR2010/004447
§ 371 (c)(1),
(2), (4) Date: Jan. 18, 2012

(87) PCT Pub. No.: WO2011/016624
PCT Pub. Date: Feb. 10, 2011

(65) Prior Publication Data
US 2012/0162905 A1    Jun. 28, 2012

(30) Foreign Application Priority Data

Aug. 3, 2009   (KR) .................. 10-2009-0071344
Oct. 29, 2009  (KR) .................. 10-2009-0103706

(51) Int. Cl.
*H05K 7/20* (2006.01)

(52) U.S. Cl.
USPC ...... 361/694; 361/695; 415/121.1; 417/423.1

(58) Field of Classification Search
None
See application file for complete search history.

(56) References Cited

U.S. PATENT DOCUMENTS 7,323,027 B1 *  1/2008  Fu et al. ................. 55/385.6
7,362,568 B2 *  4/2008  Huang ................... 361/679.48
(Continued)

FOREIGN PATENT DOCUMENTS

| JP | 10192628 | 7/1998 |
|---|---|---|
| KR | 10-2001-0018973 | 4/2001 |
| KR | 20-0277509 Y1 | 3/2002 |
| KR | 20-0359109 Y1 | 8/2004 |
| KR | 10-2008-0036967 | 4/2008 |

OTHER PUBLICATIONS

Int'l Search Report of International Application No. PCT/KR2010/004447 dated Feb. 22, 2011.

(Continued)

*Primary Examiner* — Gregory Thompson
(74) *Attorney, Agent, or Firm* — Duane Morris LLP

(57) ABSTRACT

Disclosed is a fan module used in electronic equipment and the like. The fan module of the present invention includes a dust-collecting part which has an air'-suction port and an air-discharge port, and which has a rotational region forming a passage linking the air-suction port to the air-discharge port and has a dust-collection box for collecting dust and detritus rotating in the rotational region; and a fan which is joined to one side of the dust-collecting part and makes air flow into the rotational region. The present invention can use centrifugal force to effectively remove various forms of dust and detritus contained in the air which flows into the casings of electronic equipment, household appliances and the like due to the action of a fan. Further, since a filter is not used, there is the advantage that the cooling efficiency is not reduced by the dust collection as the smooth flow of the air being sucked in is not disturbed. Further, from the long-term point of view, the thermal efficiency of electronic equipment and the like can be substantially improved as the amount of dust and detritus accumulated inside electronic equipment is minimized.

18 Claims, 19 Drawing Sheets

(56) References Cited

U.S. PATENT DOCUMENTS

| | | |
|---|---|---|
| 7,660,118 B2* | 2/2010 | Tatsukami et al. ............ 361/697 |
| 7,924,563 B2* | 4/2011 | Kobayashi et al. ........... 361/695 |
| 2007/0089862 A1* | 4/2007 | Lu et al. .................. 165/104.26 |
| 2008/0043434 A1* | 2/2008 | Tatsukami et al. ............ 361/697 |
| 2009/0244843 A1* | 10/2009 | Hirohata et al. .............. 361/696 |
| 2012/0204618 A1* | 8/2012 | Badent ........................... 72/347 |

OTHER PUBLICATIONS

Japanese Patent Office first Office Action issued on Mar. 1, 2013 in corresponding Japanese Patent Application No. 2012-523555, pp. 1-3; and including forwarding correspondence from Universal Patent Bureau dated Mar. 26, 2013.

* cited by examiner

FAN MODULE HAVING DUST-COLLECTING FUNCTION AND DUST-COLLECTING UNIT FOR THE SAME

TECHNICAL FIELD

The present invention relates to a fan module used in an electronic equipment, and more particularly, to a fan module including a dust-collecting unit for eliminating dust in air using a centrifugal force.

BACKGROUND ART

A plurality of electronic components such as a main board, a graphic card, a hard disk, a central processing unit (CPU), a power supply or the like are loaded in an electronic equipment such as a computer, an automatic teller machine (ATM), a set-top box, a display device, a medical device, an industrial computer, a communication device or the like.

The electronic component generates a large amount of heat during operation and the heat greatly influences performance and lifespan of the electronic equipment. Accordingly, a cooling means for cooling the heat generated during operation is installed in most of the electronic equipments.

In general, the cooling means is classified into a local cooling means and a systematical cooling means. The local cooling means for reducing a temperature of a specific electronic component is used in a semiconductor component, which has relatively great heat generation, such as a central processing unit (CPU), graphic card processing unit (GPU) or the like. For example, the local cooling means includes a heat radiating plate, a cooling fan, a thermoelectric element such as a Peltier element or the like, a liquid cooling means using water, a heat pipe or the like.

The systematical cooling means for an inner temperature of the electronic equipment includes a fan which is installed on a case of the electronic device and compulsorily exchanges the interior air and the exterior air. The fan may be classified into a suction fan for compulsorily sucking the cold exterior air and an exhaust fan for compulsorily exhausting the hot interior air.

The local cooling means and the systematic cooling means are installed together in most of the electronic devices, where the heat taken from the electronic components by the local cooling means is radiated to the exterior through the systematic cooling means.

When the suction fan or the exhaust fan used as the systematic cooling means operates, the exterior air flows inwardly and various dusts also flow into the electronic device. Since the dusts accumulated in the electronic device for a long time cause an electric shortage of the electronic components or deteriorate heat radiating performance of the electronic components, the dusts have a bad influence on property or lifespan of the electronic equipment. Specifically, since metallic dust or the like flows into the electronic equipment used in the industrial site differently from the household appliance, there exists high probability that the metallic dust causes fatal damage of the electronic equipment.

For the purpose of solve the above problems, it has been recently suggested to install a filter for eliminating dust at front of or at back of the suction fan which the exterior air flows into. However, since the filter disturbs smooth flow of air, an overall cooling efficiency is reduced. In addition, since an amount of adsorbed dust rapidly increases after an amount of dust over a critical value is adsorbed onto the filter, a heat radiating efficiency is rapidly reduced. As a result, although a user should periodically replace the filter, the periodic replacement of the filter is terribly inconvenient to the user.

The problems caused by dust in flowing air are not limited to the electronic equipments. For example, a household appliance such as a television, an audio system, a refrigerator, an air conditioner or the like has problems such that a large amount of dust are accumulated in a case when the household appliance operates for a long time. In addition, a ventilation system or an electric fan has problems such that a duct or a window of the ventilation system or an interior or a periphery of the electric fan is contaminated with dust.

DISCLOSURE

Technical Problem

The present invention has been made in an effort to solve the problems occurring in the related art, and an object of the present invention is to provide a means for effectively eliminating various dusts in air flowing into an electronic equipment or a household appliance without deteriorating a heat radiating performance of the electronic equipment or the household appliance.

In addition, another object of the present invention is to provide a means for effectively eliminating dust in air by installing the means in the middle of an air-flowing path such as a duct or a window of a ventilation system or the like.

Technical Solution

In order to achieve the above object, a fan module installed on a case of an electronic equipment or a household appliance and inputting an air into the case includes: a dust-collecting unit having a rotation region, at least one air-suction port and at least one air-discharge port, the at least one air-suction port and the at least one air-discharge port communicating with the rotation region; and a fan combined with the dust-collecting unit and inputting the air into the rotation region, wherein the dust-collecting unit includes: a housing having the rotation region therein and open portions at a front end and a rear end thereof, the open portions communicating with the rotation region; a rotation inducing part combined with a front end of the rotation region and inducing the air to spirally rotate, the rotation inducing part including the at least one air-suction port; a guide wall combined with the housing without separation at a rear end of the rotation region and protruding toward a central axis along a longitudinal direction of the rotation region, the guide wall surrounding the at least one air-discharge port disposed coaxially with the central axis of the rotation region; and a dust-collecting box combined with the housing and collecting a dust rotating in the rotation region through one of a dust-collecting path connected to the housing and a dust-collecting hole formed on the housing.

In addition, the fan includes an axial fan generating an air flow along a rotating shaft thereof, and the central axis of the rotation region is disposed coaxially with the rotating shaft of the fan.

Further, the guide wall is disposed perpendicular to the central axis of the rotation region. Moreover, a rear end portion of the guide wall is combined with the housing without separation, and a front end of the guide wall is disposed in the rotation region.

Advantageous Effects

According to the present invention, various dusts in air that flows into a case of an electronic equipment, a household appliance or the like by operation of a fan is effectively eliminated using a centrifugal force. In addition, since a filter is not adopted, smooth flow of sucked air is not disturbed and reduction in cooling efficiency is prevented. Further, in a long-term basis, since an amount of dust accumulated in an electronic equipment is minimized, heat radiating efficiency of an electronic equipment or the like is greatly improved.

Moreover, when a fan module or a dust-collecting unit of the present invention is installed in the middle of an air-flowing path such as a duct or window of a ventilation system or the like, dust in air is effectively eliminated.

*Illustration about Reference Numbers of Important Elements of Figures*

| | |
|---|---|
| 100, 200: fan module | 110: fan |
| 120: dust-collecting unit | 130: first part |
| 131: housing | 132, 144: flange |
| 133: guide groove | 134: shielding plate |
| 136: covering plate | 138: dust-collecting path |
| 139: feedback path | 140: second part |
| 141: guide wall | 142: guide pipe |
| 150: dust-collecting box | 152: dust-collecting hole |
| 154: feedback hole | 260: auxiliary dust-collecting unit |
| I: air-suction port | O: air-discharge port |
| R: rotation region | C: case |
| D: duct | W: wall |

BEST MODE FOR INVENTION

Reference will now be made in detail to the preferred embodiments, examples of which are illustrated in the accompanying drawings.

In a fan module, for convenience of illustration, a first portion which air flows into may be represented by a front end and a second portion opposite to the first portion may be represented by a rear end. In addition, a direction of a virtual line connecting the front end and the rear end may be represented by a longitudinal direction. Further, a foreign substance in air such as a nap, a fine particle, a mote or the like may be represented by a dust.

First Embodiment

Figure 1:
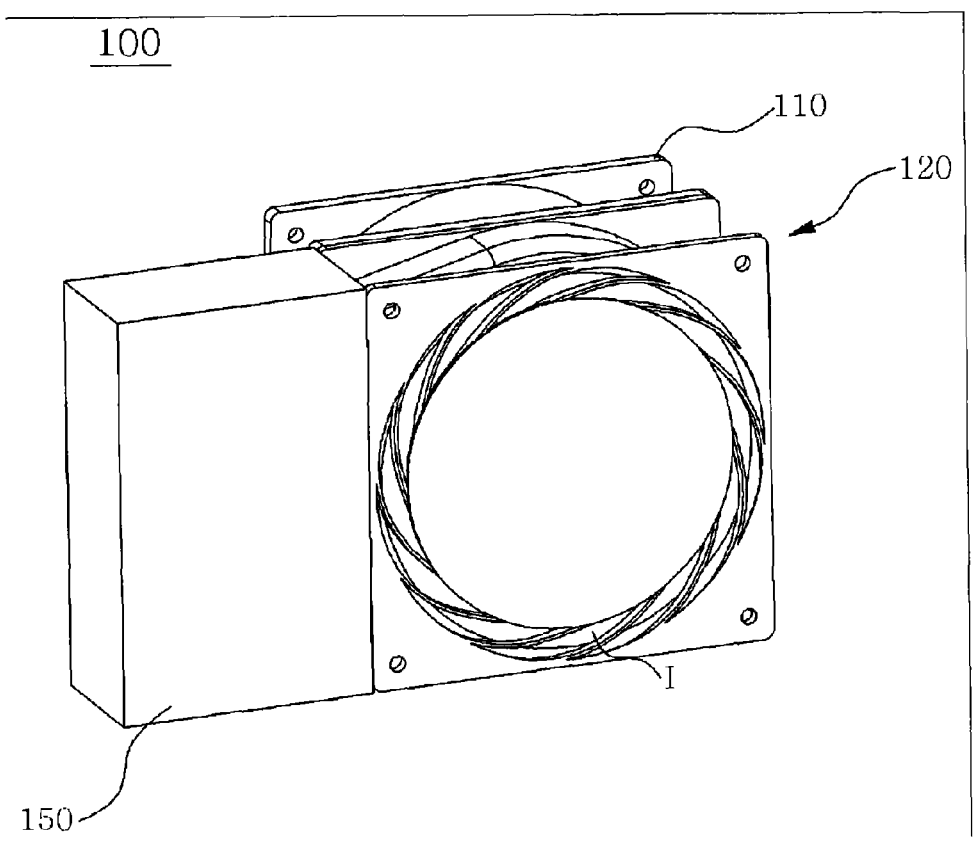
FIGS. 1 to 3 are a perspective view, an exploded perspective view and a cross-sectional view, respectively, showing a fan module 100 according to a first embodiment of the present invention.
Figure 2:
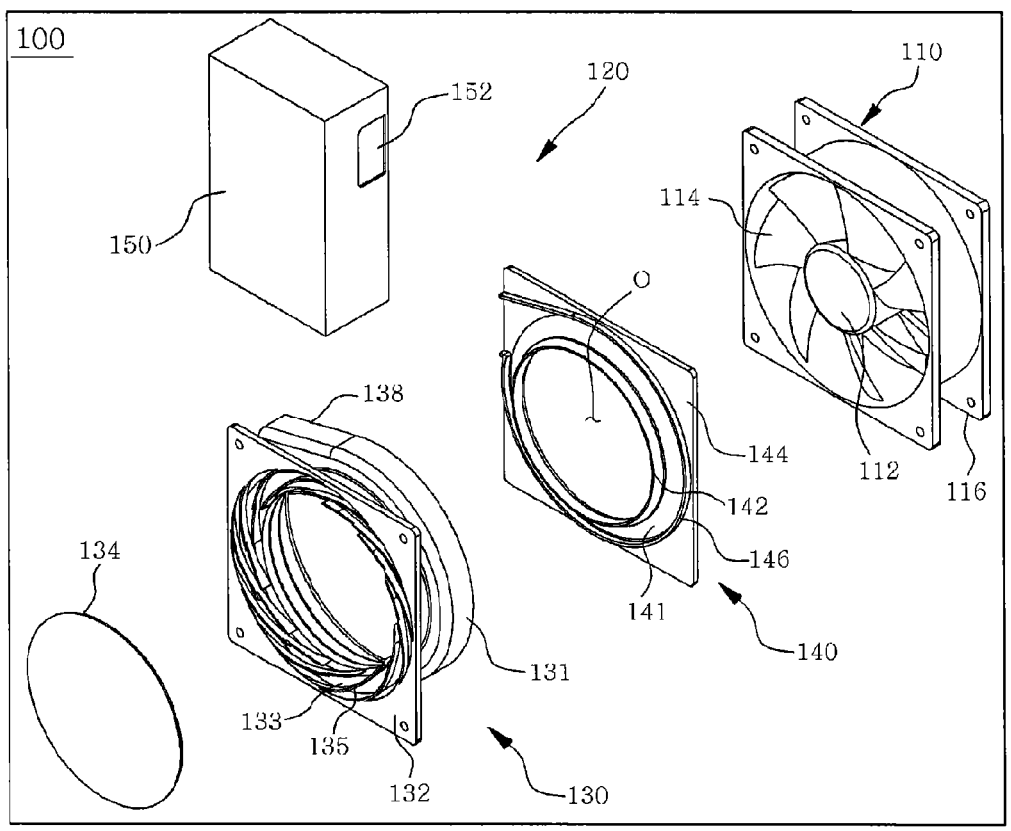
Figure 3:
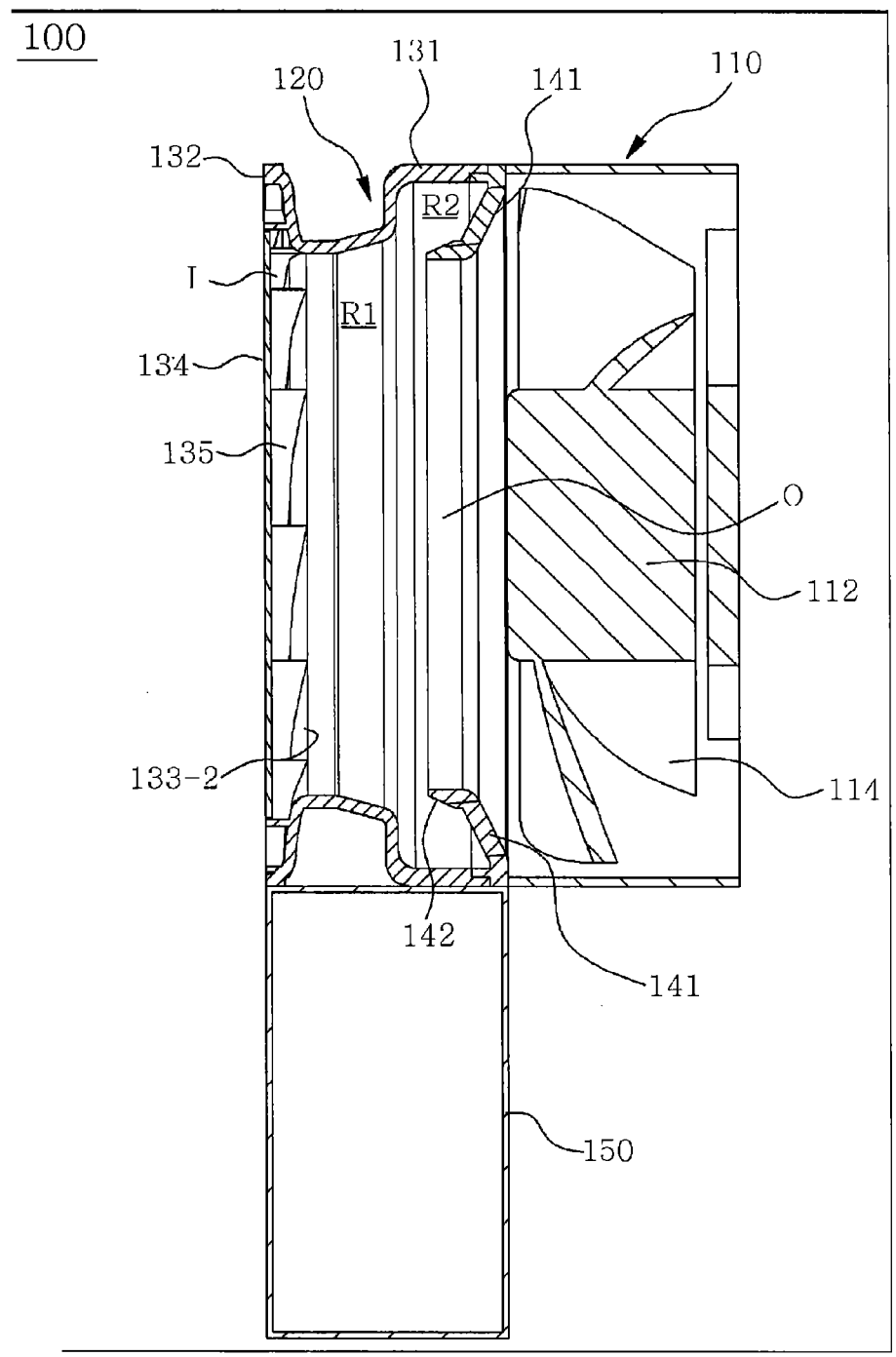

FIGS. 1 to 3 are a perspective view, an exploded perspective view and a cross-sectional view, respectively, showing a fan module 100 according to a first embodiment of the present invention.

A fan module 100 according to a first embodiment of the present invention includes a fan 110 for generating an air flow and a dust-collecting unit 120 for filtering a dust in flowing air. The dust-collecting unit 120 may be combined with a side of the fan 110.

The fan 110 includes a rotating shaft 112 that is driven by a motor and a plurality of rotating blades 114 that is radially disposed on a circumference of the rotating shaft 112. A flange 116 may be formed on a front end or a rear end of the fan 110 for combining the fan 110 with the dust-collecting unit 120 or a case of an electronic equipment.

In an embodiment of the present invention, specifically, a small axial fan that is widely used for cooling or exhausting in an electronic equipment, a household appliance or the like may be used as the fan 110. The axial fan makes air flow along a direction of the rotating shaft 112. Although the other kind of fan may be used as the fan 110, it is preferable to use an axial fan for compactly fabricating the fan module 100 to be installed in an electronic equipment or a household appliance.

Since the axial fan used in a computer or the like has a high air volume and a low air pressure, design for the dust-collecting unit 120 should be based on the high air volume and the low air pressure of the axial fan. Since a lower fan of a high pressure type used for a vacuum cleaner or the like has a loud noise and a great size, it is difficult to install the blower fan in a computer or the like having a restricted space. Accordingly, the present invention provides a fan module having a dust-collecting function and including a small axial fan of a low noise and a low air pressure used for systematic cooling of a computer.

In addition, the fan 110 used in the present invention may be a complete product including the rotating shaft 112 and the plurality of rotating blades 114 installed on a frame or may include the rotating shaft 112 and the plurality of rotating blades 114 installed on an element (a housing or the like) of the dust-collecting unit 120. The above composition of the fan may be equally applied to the other embodiments.

The dust-collecting unit 120 for collecting dust in flowing air using a centrifugal force includes a rotation region R where the flowing air rotates. As a rotation speed of air in the rotation region R increases (i.e., as a centrifugal force increases), an efficiency of collecting dust increases. Specifically, as mentioned above, since an axial fan for a computer has a relatively low air pressure, the dust-collecting unit 120 may be designed such that a loss of the air pressure is minimized and a rotation speed of air is maximized.

The dust-collecting unit 120 according to the first embodiment of the present invention includes an inner space provided as the rotation region R and an air-suction port I communicating with the rotation region R is formed on a front end of the dust-collecting unit 120. In addition, a guide wall 141 is formed on a rear end of the rotation region R. The guide wall 141 protrudes to an interior of the rotation region R along a circumference of the rotation region R. A penetration portion surrounded by an inner end of the guide wall 141 functions as an air-discharge port O.

Further, the dust-collecting unit 120 includes a dust-collecting box 150 collecting dust rotating in the rotation region R.

The fan 110 may be combined with a front end or a rear end of the dust-collecting unit 120. For the purpose of obtaining flow of the exterior air into the rotation region R with a uniform pressure, it is preferable that the fan 110 is combined with the rear end of the dust-collecting unit 120, i.e., the rear end of the guide wall 141.

The dust-collecting unit 120 may be formed as a single body. For convenience of fabrication, as shown in FIG. 2, it is preferable that a first part 130 including the air-suction port I and the rotation region R and a second part 140 including the guide wall 141 and the air-discharge port O are individually fabricated and the dust-collecting unit 120 is formed by assembling the first and second parts 130 and 140. Alternatively, the first and second parts 130 and 140 may be fabricated as a single body.

The first part 130 includes a housing 131 and a flange 132. The housing includes an inner space provided as the rotation region R and open portions communicating with the rotation region R at front and rear ends thereof. The flange 132 outwardly protrudes from a circumference of the front end open portion of the housing 131. The inner space of the housing is provided as the rotation region R.

A plurality of guide grooves 133 communicating with the inner space of the housing 131 are formed on a front end surface of the flange 132. Each of the plurality of guide grooves 133 functions as the air-suction port I by the front end open portion of the housing 131 and a shielding plate 134 covering an inner end portion of each guide groove 133.

Since it is simple and easy to form the dust-collecting unit 120 by a plastic injection molding method, it is preferable that the housing 131 of the first part 130 has substantially a circular pipe shape. Accordingly, a central axis of the housing 131 is disposed coaxially with the fan 110 combined with the dust-collecting unit 120.

The rotation region R formed in the housing 131 may have a constant inner diameter from the front end to the rear end. Alternatively, as shown in figures, the rotation region R may have a variable inner diameter such that the inner diameter of the rear end is greater than the inner diameter of the front end.

In the first embodiment of the present invention, the rotation region R in the housing 131 is divided into first and second rotation regions R1 and R2 from the front end such that the inner diameter of the second rotation region R2 adjacent to the rear end is greater than the inner diameter of the first rotation region R1.

By the above structure, when air and dust rotating in the first rotation region R1 flow into the second rotation region R2, the dust that is relatively further influenced by a centrifugal force promptly moves to an inner wall of the second rotation region R2 and is separated from the clean air. As a result, the dust is effectively separated even in a small space and a size of the dust-collecting unit 120 is minimized.

In addition, it is preferable that the inner diameter of the first rotation region R1 is greater than an outer diameter of a front end portion of the guide wall 141 disposed at the rear end. When the inner diameter of the first rotation region R1 is smaller than the outer diameter of the front end portion of the guide wall 141, the dust rotating in the first rotation region R1 may be outputted through the air-discharge port O before the dust moves to the inner wall of the second rotation region R2. Specifically, when the dust-collecting unit 120 is formed to have a thin profile such that the rear end of the first rotation region R1 is very close to the air-discharge port O, a rate of collecting dust may increase by forming the second rotation region R2 having a greater inner diameter at the rear end of the first rotation region R1.

In addition, for the purpose of minimizing a loss of the air pressure, it is preferable that the inner diameter of the second rotation region R2 is similar to or greater than a diameter of the fan 110.

In FIG. 3, the inner diameters of the first and second regions R1 and R2 are not gradually changed but are sharply changed at a border portion. When the inner diameter gradually increases, the dust-collecting unit 120 should be elongated to increase an efficiency of collecting dust. For the purpose of forming the fan module 100 to have a thinner profile, as shown in figures, it is preferable that the inner diameters of the first and second rotation regions R1 and R2 are sharply or discontinuously changed.

Accordingly, the air flowing into the housing 131 through the air-suction port I spirally rotates and moves forward in the first rotation region R1 and a rotational radius further increases in the second rotation region R2 so that the dust relatively further influenced by a centrifugal force can promptly rotate along the inner wall of the second rotation region R2. In addition, the clean air relatively less influenced by the centrifugal force is smoothly exhausted through the air-discharge port O close to the rear end of the first rotation region R1.

A dust-collecting path 138 is communicated with the housing 131 such that the dust-collecting path 138 is connected to a circumference surface of the housing 131 substantially along a tangential direction. Accordingly, the dust rotating along the inner wall of the housing 131 by the centrifugal force is smoothly exhausted to the dust-collecting box 150 through the dust-collecting path 138 connected along the tangential direction.

When the dust-collecting path 138 is connected to the rear end or a position close to the rear end of the housing 131, the dust rotating in the rear end of the rotation region R is smoothly collected. Alternatively, a dust-collecting hole (not shown) communicating with the dust-collecting box 150 may be formed on a side surface of the housing 131 without forming the dust-collecting path 138.

The air-suction port I is designed such that the air flows into the rotation region R with rotation. Accordingly, a direction of outlet of the air-suction port I is substantially perpendicular to a longitudinal direction of the housing 131 and is along the tangential direction of the rotation region R. For the purpose of preventing loss of air pressure or scattering of dust due to strong collision of the flowing air and the inner wall of the rotation region R, it is preferable that the direction of the outlet of the air-suction port I is slightly biased toward the central axis as compared with the tangential direction of the rotation region R and is slightly biased toward the rear end of the housing 131.

In the first embodiment of the present invention, the plurality of guide grooves 133 are formed to have a spiral shape directing from a peripheral portion to a central portion of the flange 132. For the purpose of sucking air smoothly, the plurality of guide grooves 133 are densely formed on the flange 132 and a very thin sidewall 135 is formed between the guide grooves 133 as shown in figures. Since a thickness of the sidewall 135 varies according to the number of the guide grooves 133, the sidewall 135 is not restricted to the shape shown in the figures.

Figure 4:
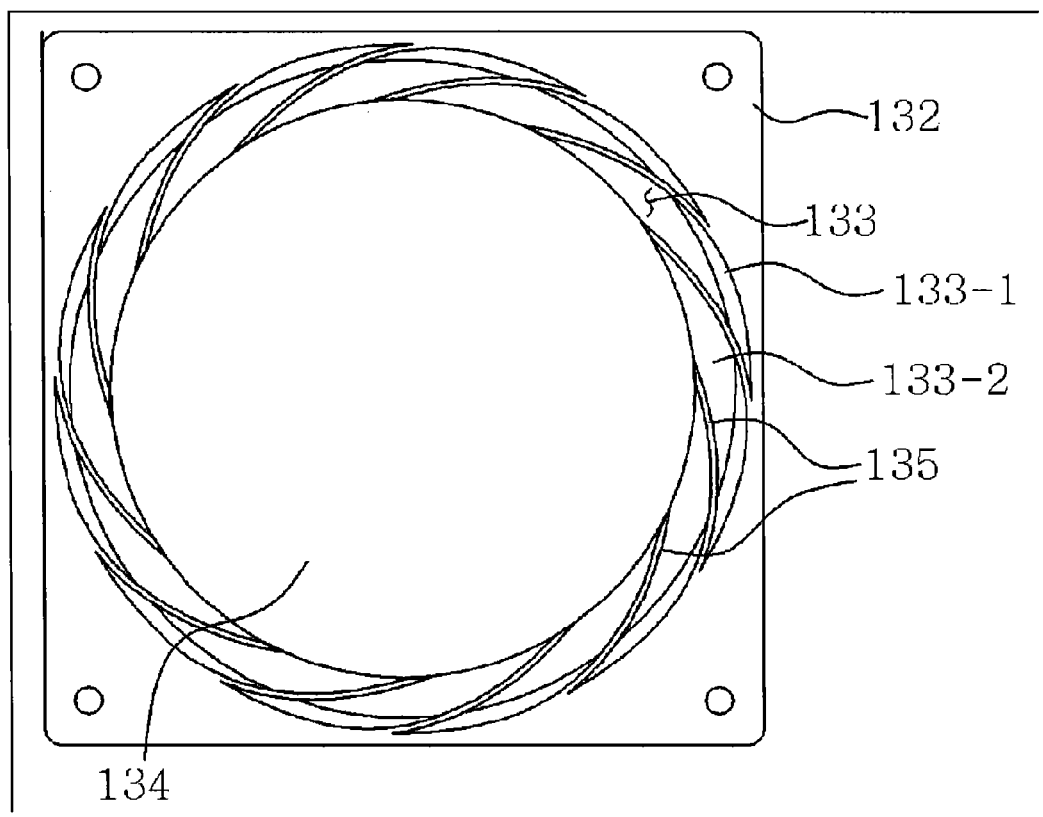
FIG. 4 is a front view showing a dust-collecting unit.

An inner wall at an outer end of the guide grooves 133 may be formed to be perpendicular to a front end surface of the flange 132. For the purpose of naturally changing a direction of air while air flows into the dust-collecting unit 120, as shown in a front view of FIG. 4, it is preferable that the inner wall 133-1 at the outer end of the guide grooves 133 is formed to have a slanting surface such that a bottom of the inner wall is closer to the rotation region R.

In addition, the bottom surface 133-2 of the guide grooves 133 may be formed to be perpendicular to the longitudinal direction of the housing 131. For the purpose of preventing scattering of inputted dust due to collision with an end portion of the sidewall 135, as shown in FIG. 3, it is preferable that the bottom surface 133-2 of the guide grooves 133 is formed to slant forward a rear end portion of the housing 131.

Accordingly, the air inputted from exterior advances into the guide grooves 133 and then a direction of the air is changed along the spiral guide grooves 133. Next, the air flows into the housing 131 through the rear surface of the shielding plate 134. Since the bottom surface 133-2 of the guide grooves 133 slants, a vector of the input direction of the air has a component of the longitudinal direction. As a result, the air further smoothly moves to the fan 110 with rotating along the inner wall of the housing 131.

In the first embodiment, a plurality of air-suction ports I are symmetrically formed at a periphery of the front end open portion of the housing 131 using the guide grooves 133 and the shielding plate 134.

The shape and the position of the air-suction ports I are not restricted and may vary to have various shapes and positions.

Figure 5:
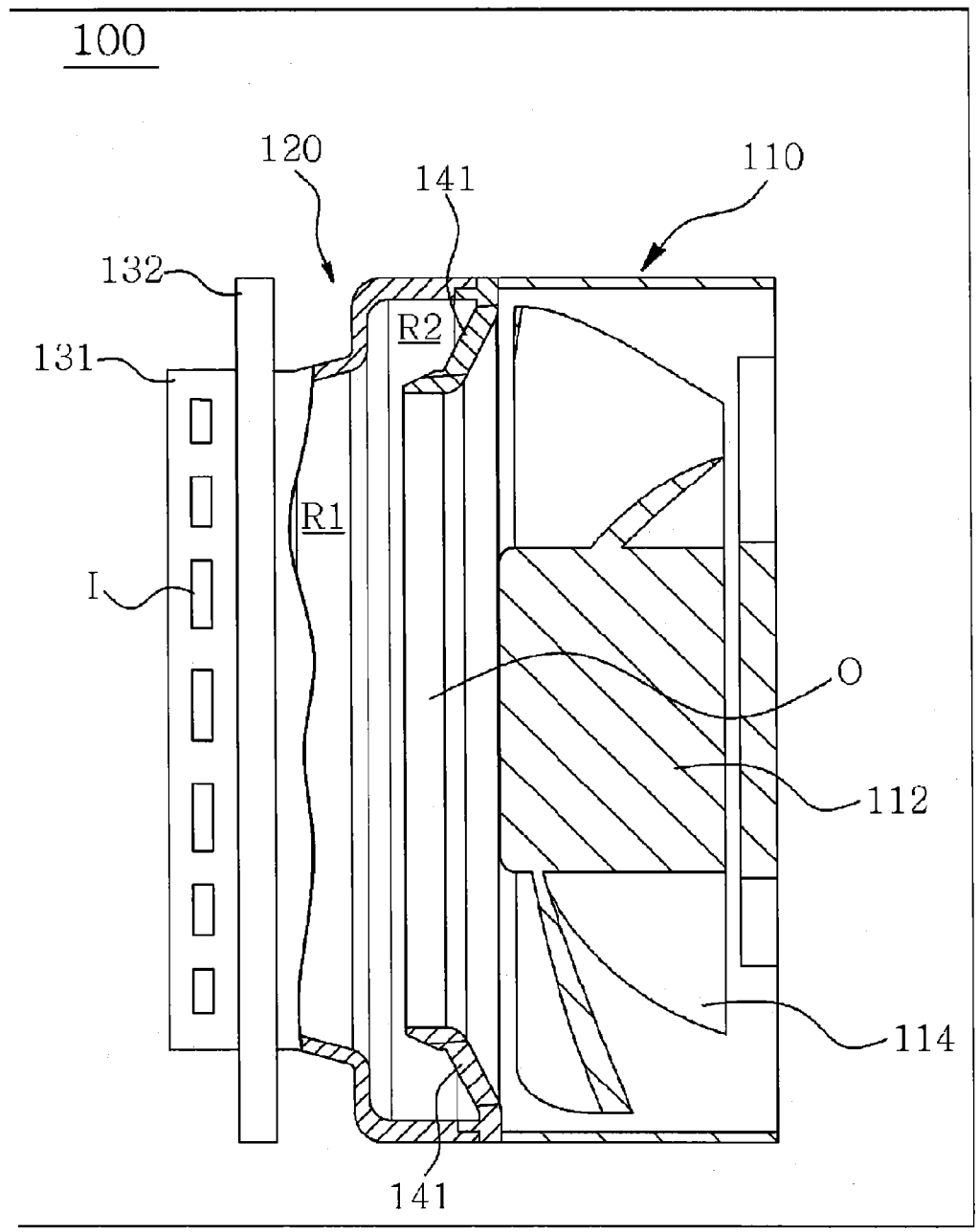
FIG. 5 is a partial cross-sectional view showing a air-suction port on a side surface of a housing.

For example, as shown in a partial cross-sectional view of FIG. 5, the plurality of air-suction ports I may be formed on a side surface adjacent to the front end portion of the housing 131 along a circumference. It is preferable that a vector of the output direction of the air-suction ports I communicating with the rotation region R has a component of the longitudinal direction. When the fan module 100 is installed in a case of an electronic equipment, the air-suction ports I is exposed outside the case. Accordingly, when the air-suction ports I are formed on the side surface of the housing 131, the flange 132 for installation on the case is formed at the further rear end as compared to the air-suction ports I.

As another shape of the air-suction ports I, a plurality of fixing blades slanting along a predetermined direction may be formed at the front open portion of the housing 131 for changing the flowing direction of air and a space between the fixing blades may be used as the air-suction port I.

The second part 140 includes the guide wall 141 and a flange 144. The guide wall 141 includes the air-discharge port O and the flange 144 outwardly protrudes from the rear end of the guide wall 141. The flange 144 is used for combination with a case of an electronic equipment or the like or the fan 100.

The guide wall 141 prevents the dust rotating along the inner wall of the housing 131 due to the centrifugal force from being exhausted through the air-discharge port O before the dust is collected in the dust-collecting box 150 and exhausts the clean air separated from the dust through the air-discharge port.

Since the dust rotates along the inner wall of the housing 131, one end of the guide wall 141 is combined with the housing 131 without separation and the other end of the guide wall 141 protrudes forward a central axis of the housing 131 with a predetermined width. A penetration portion surrounded by the other end of the guide wall 141 is provided as the air-discharge port O. A diameter of the air-discharge port O is sufficiently greater than a diameter of the rotation shaft 112 of the fan 110 so that the air pressure generated by the rotating blades 114 can be transmitted into the rotation region R maximally.

The guide wall 141 may be formed as a vertical wall with respect to the central axis of the housing 131.

In figures, the guide wall 141 has a funnel shape where a diameter gradually increases along a direction from the front end to the rear end so that a space can be generated between the fan 110 combined with the rear end of the housing 131 and the guide wall 141 and loss in air pressure of the fan 110 can be minimized. The front end of the guide wall 141 is disposed in the rotation region R and the rear end of the guide wall 141 is combined with the housing 131 without separation at the rear end of the rotation region R.

Specifically, it is preferable that the front end of the guide wall 141 is disposed in the second rotation region R2 of the housing 131. As a result, an outer diameter of the front end portion of the guide wall 141 may be smaller than an inner diameter of the second rotation region R2.

In addition, it is preferable that the front end of the guide wall 141 is disposed at a position a little bit closer to the rear end rather than the first rotation region R1 of the housing 131. As a result, the dust flowing into the second rotation region R2 does not move to the air-discharge port O but moves to the inner wall of the housing 131 due to the centrifugal force. Accordingly, only the clean air where the dust is eliminated can be exhausted through the air-discharge port O.

When the fan 110 is installed to be sufficiently separated from the guide wall 141 or the fan 110 is installed on the other side, the guide wall 141 may be formed as a vertical wall with respect to the central axis of the housing 131.

In figures, a guide pipe 142 having a circular pipe shape is combined with the front end of the guide wall 141. The guide pipe 142 is disposed coaxially with the housing 131 and the rear end of the guide pipe 142 is combined with the periphery of the air-discharge port O without separation.

When the fan module 100 is formed to have a thin profile, the guide wall 141 has a short length. As a result, the dust having a relatively light weight among dusts rotating along the inner wall of the housing 131 may be swept out with the clean air through the air-discharge port O. The guide pipe 142 prevents the above-mentioned phenomenon with a diameter of the air-discharge port O kept.

A connecting means 146 for combining with the housing 131 of the first part is formed on the rear end of the guide wall 141 or on the flange 144. The connecting means 146 may include a screw thread for combining with the housing 131 or may include an inserting groove where the rear end of the housing 131 is inserted. Alternatively, the connecting means 146 may include a combination means where the rear end of the housing 131 is combined through a stationary fit type.

For example, the dust-collecting box 150 may be combined with the housing 131 in a drawer type such that the dust-collecting box 150 is separable from the housing 131. In addition, a door (not shown) for removing collected dust may be formed on a side of the dust-collecting box 150. Further, the dust-collecting box 150 may have an open surface contacting the housing. As shown in figures, the dust-collecting box 150 may have a closed surface contacting the housing, and a dust-collecting hole 152 communicating with the dust-collecting path 138 may be formed on the closed surface.

Moreover, the dust-collecting box 150 may be formed such that the penetration portion on the side surface of the housing 131 communicates with the dust-collecting hole 152 of the dust-collecting box 150 without through the dust-collecting path 138.

It is preferable that the dust-collecting hole 152 is formed to be biased with respect to a center. For example, since the dust-collecting hole 152 is disposed at an upper position even when the fan module 100 is installed to be rotated by 90 degrees clockwise, dust-collecting function may be smoothly performed.

Figure 6:
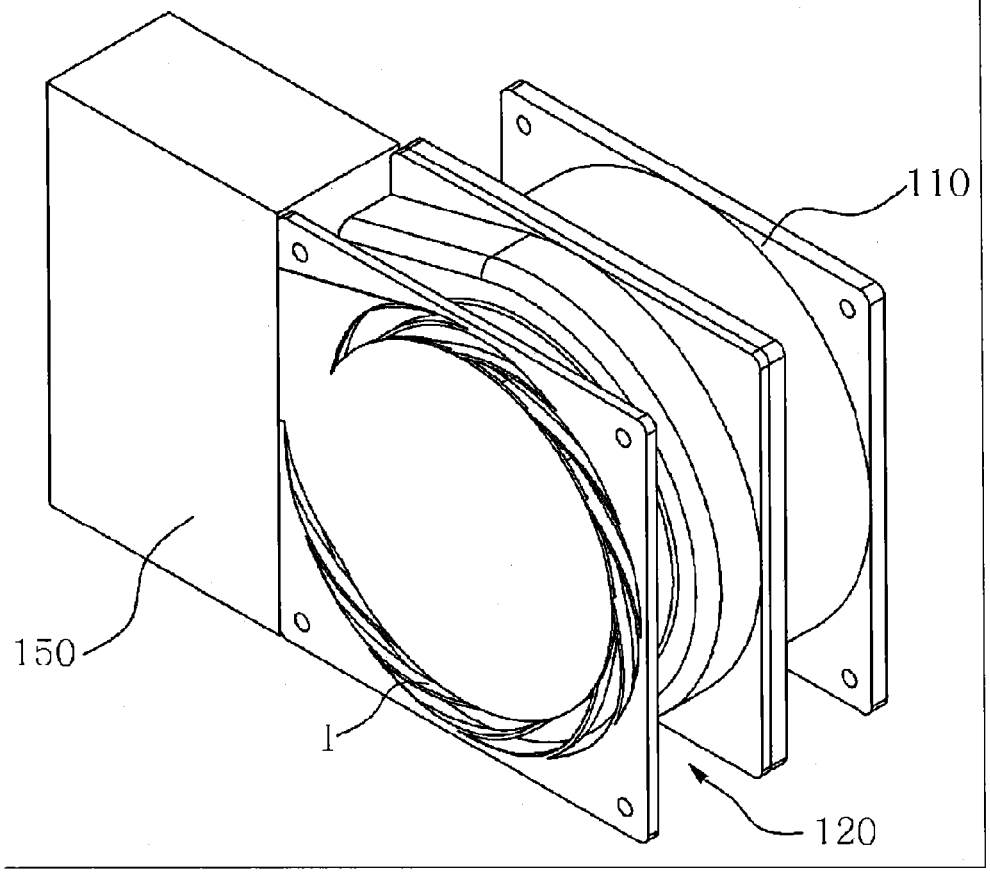
FIGS. 6 to 8 are a perspective view, an exploded perspective view and a cross-sectional view, respectively, showing a fan module 100 according to a modified embodiment of the first embodiment of the present invention.
Figure 7:
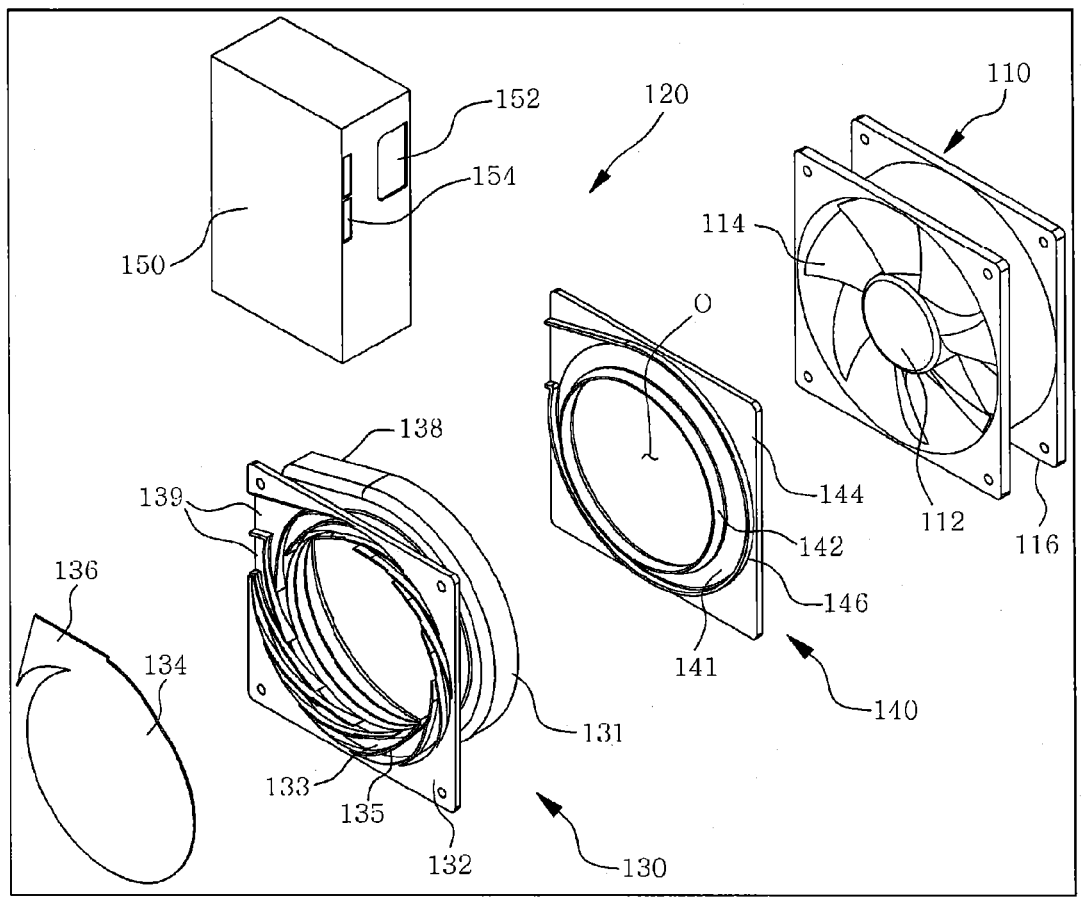
Figure 8:
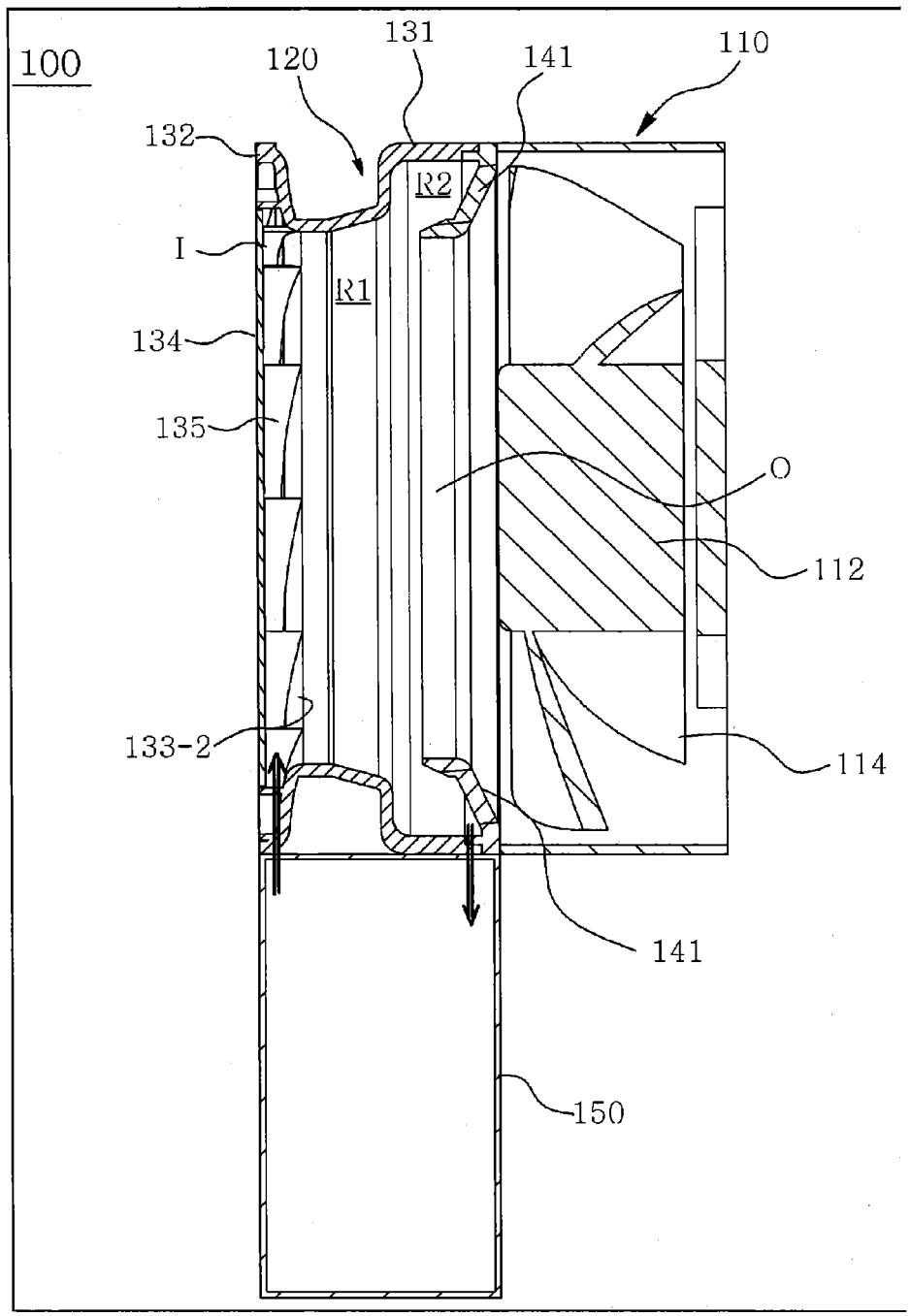

FIGS. 6 to 8 are a perspective view, an exploded perspective view and a cross-sectional view, respectively, showing a fan module 100 according to a modified embodiment of the first embodiment of the present invention. The dust-collecting unit 120 includes a feedback path 139 where the air of the dust-collecting box 150 is exhausted into the housing 131. Alternatively, a feedback hole (not shown) communicating with the dust-collecting box 150 may be formed on a side of the housing 131 without the feedback path 139.

The dust-collecting box 150 may have an open surface contacting the housing. Alternatively, as shown in figures, the dust-collecting box 150 may have a closed surface contacting the housing, and a feedback hole 154 communicating with the feedback path 139 or the feedback hole (not shown) of the housing 131 may be formed on the closed surface separately from the dust-collecting hole 152 communicating with the dust-collecting path 138.

One end of the feedback path 139 communicates with the feedback hole 154 of the dust-collecting box 150 and the other end of the feedback path 139 communicates with the front end portion of the rotation region R. When the feedback path 139 is connected to the housing 131, an inner pressure of the dust-collecting box 150 is reduced and the dust is inputted into the dust-collecting box 150 more easily. When the feedback path 139 is not formed, the dust may not be easily inputted through the dust-collecting path 138 due to the inner pressure of the dust-collecting box 150.

For the purpose of forming the feedback path 139, in the first embodiment of the present invention, an outer end portion of at least one guide groove 133 communicates with the feedback path 139 and a whole of the at least one guide groove 133 is shielded with a covering plate 136. When the covering plate 136 is not installed, the inner air of the dust-collecting box 150 may not be smoothly exhausted due to the air sucked from exterior.

It is preferable that the covering plate 136 protrudes from a side of the shielding plate 134 and the covering plate 136 and the shielding plate 134 are formed as a single body.

Figure 9:
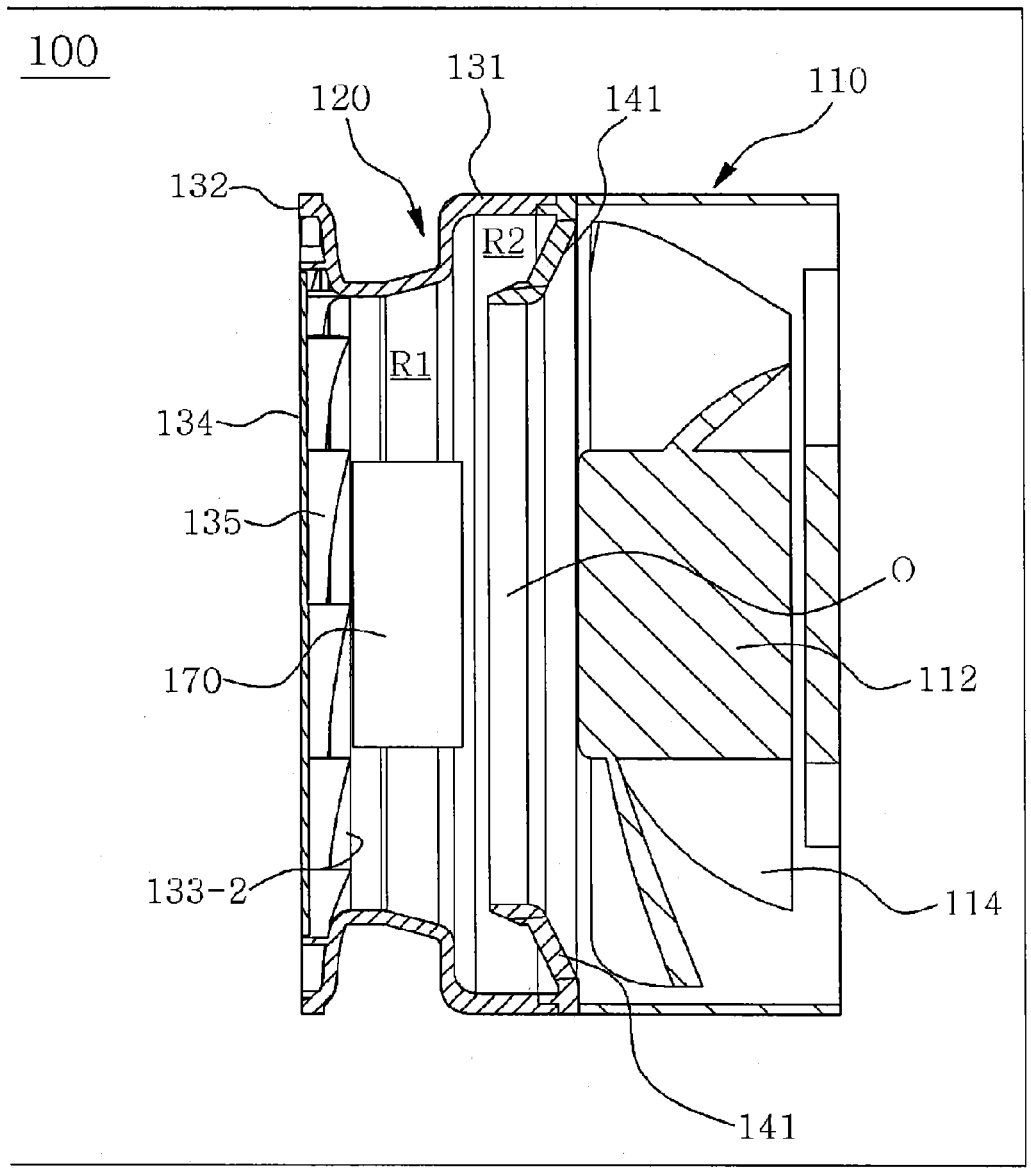
FIG. 9 is a cross-sectional view showing a rotation guide in a housing.

As shown in FIG. 9, a rotation guide 170 may be formed inside the shielding plate 134 shielding the front end open portion of the housing 131 in the dust-collecting unit 120. According to the experiment, an eddy dust rotating at the same place may be observed in the vicinity of the central axis of the housing 131 in the rotation region R1 and R2, and the eddy dust may be exhausted through the air-discharge port O. When the rotation guide 170 is formed in the rotation region, especially in the first rotation region R, the eddy dust rotating at the same place is prevented.

The rotation guide 170 includes a circular circumference surface such as cylinder, a circular pipe or the like, and is disposed coaxially with the housing 131. For the purpose of minimizing loss of air pressure, the rear end of the rotation guide 170 is disposed in front of the air-discharge port O.

Figure 10:
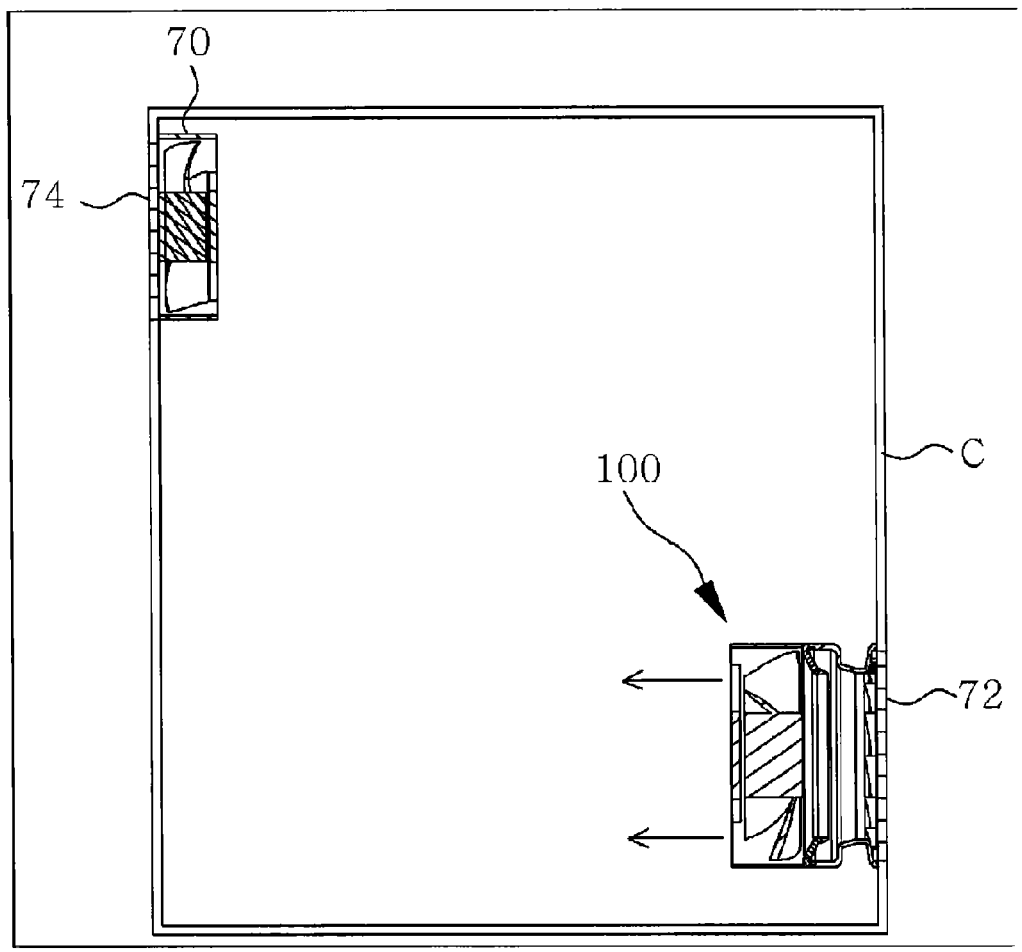
FIGS. 10 to 12 are cross-sectional views showing an electronic equipment including a fan module according to a first embodiment of the present invention.
Figure 11:
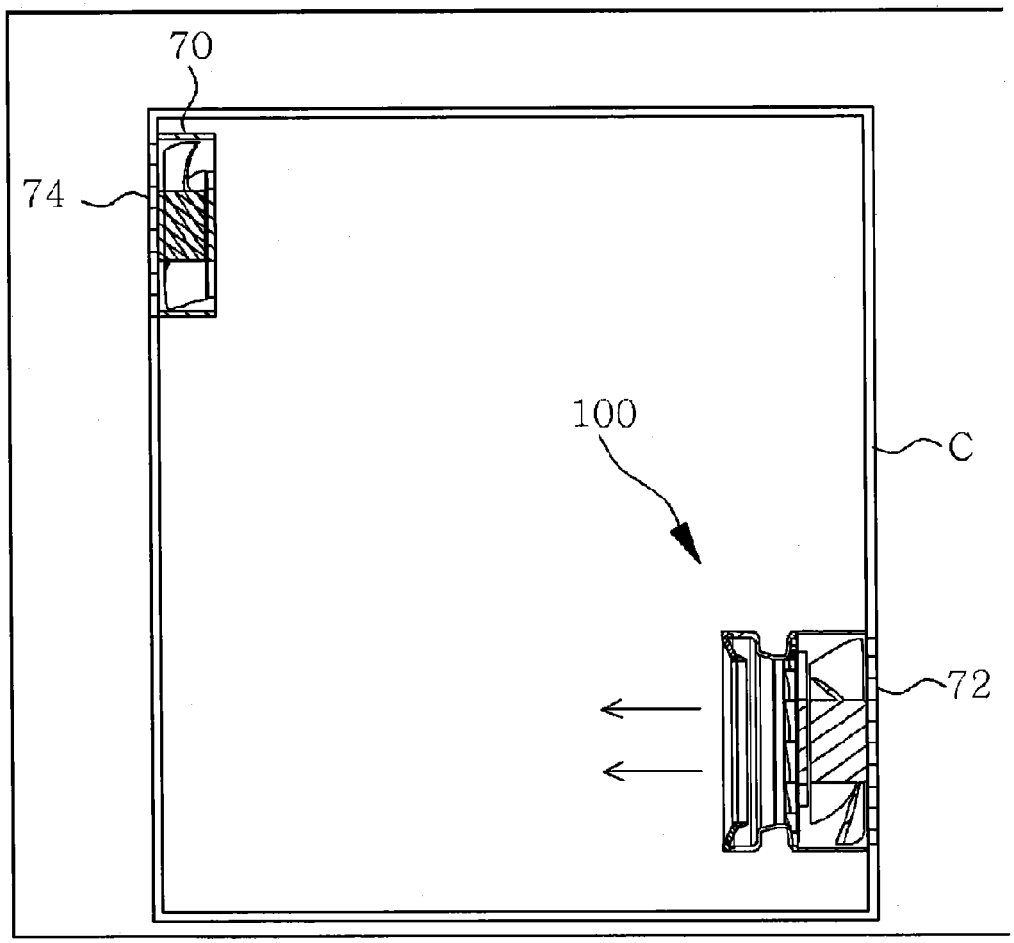
Figure 12:
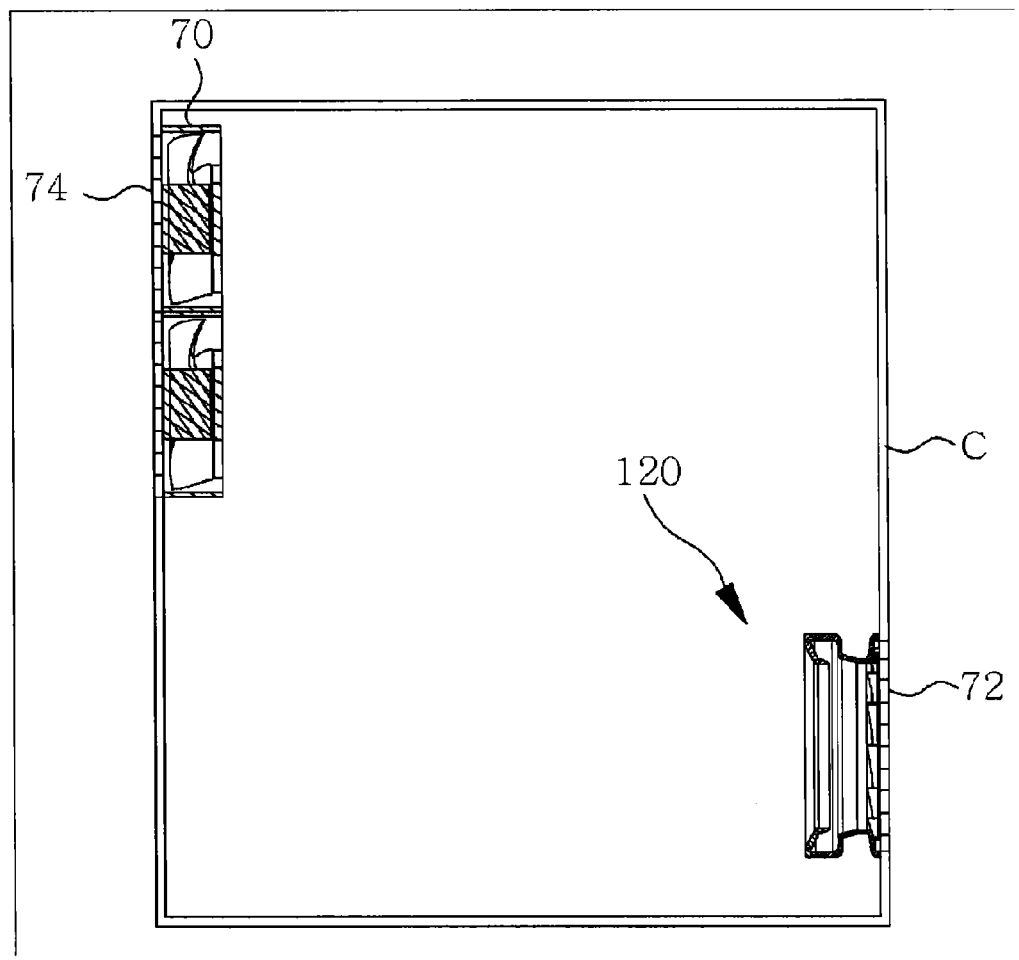

FIGS. 10 to 12 are cross-sectional views showing an electronic equipment (e.g., a computer) including a fan module according to a first embodiment of the present invention.

As shown in figures, an electronic equipment includes a case C where a plurality of electronic components are installed. A suction hole 72 is formed on a side of the case C and an exhaust hole 74 is formed on another side of the case C.

Although it is preferable that a fan module 100 is installed in an interior of the case C, the fan module 100 may be installed in an exterior of the case C. When the fan module 100 is installed in the interior of the case C, the fan module 100 is installed such that the air-suction port I faces the suction hole 72. When the fan module 100 is installed in the exterior of the case C, the fan module 100 is installed such that the air-discharge port O faces the suction hole 72.

The systematic cooling of the electronic equipment using the fan module 100 may be realized in various types.

For example, when the fan module 100 is installed on the suction hole 72, the fan 110 is formed at the rear end of the dust-collecting unit 120 as shown in FIG. 10. Alternatively, when the fan module 100 is installed on the suction hole 72, the fan 110 is formed at the front end of the dust-collecting unit 120 as shown in FIG. 11. Although not shown in figures, the fan 110 may be formed at both the rear end and the front end of the dust-collecting unit 120.

In addition, for the purpose of increasing an exhaust pressure, an exhaust fan 70 may be further formed on the exhaust hole 74.

Further, as shown in FIG. 12, the dust-collecting unit 120 is formed on the suction hole 72 and inflow of air into the dust-collecting unit 120 is generated by using an exhaust fan 70 formed on the exhaust hole 74.

Since FIGS. 10 to 12 show exemplary installation methods for a fan module 100 according to a first embodiment of the present invention, the dust-collecting unit 120, the fan 110 and the exhaust fan 70 may be differently combined in another embodiment. The various combinations may be understood by those skilled in the art without addition drawings.

Operation of the fan module 100 according to a first embodiment of the present invention will be illustrated with reference to FIG. 3 hereinafter.

When the fan 110 starts operating, the exterior air flows into the rotation region R through the air-suction port I of the housing 131. The rotational air of the first rotation region R1 through the air-suction port I spirally rotates and advances.

The clean air is exhausted through the air-discharge port O adjacent to the rear end of the first rotation region R1 and the dust relatively further influenced by a centrifugal force rotates along the inner wall of the housing 131 by the centrifugal force.

The dust rotating along the inner wall in the first rotation region R1 enters the second rotation region R2 having the greater inner diameter and at the same time promptly moves to the inner wall of the housing 131. Next, the dust rotates in a space between the guide wall 141 and the housing 131 and is collected in the dust-collecting box 150.

Second Embodiment

Figure 13:
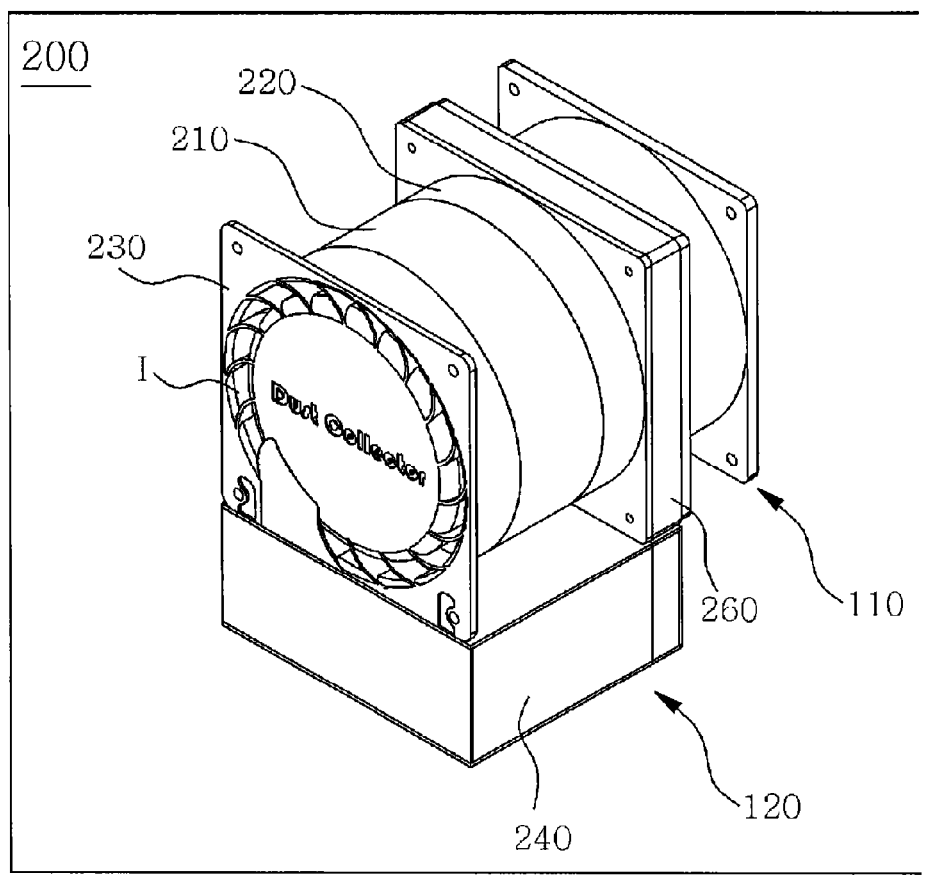
FIGS. 13 to 15 are a perspective view, a cross-sectional view and an exploded perspective view, respectively, showing a fan module 200 according to a second embodiment of the present invention.
Figure 14:
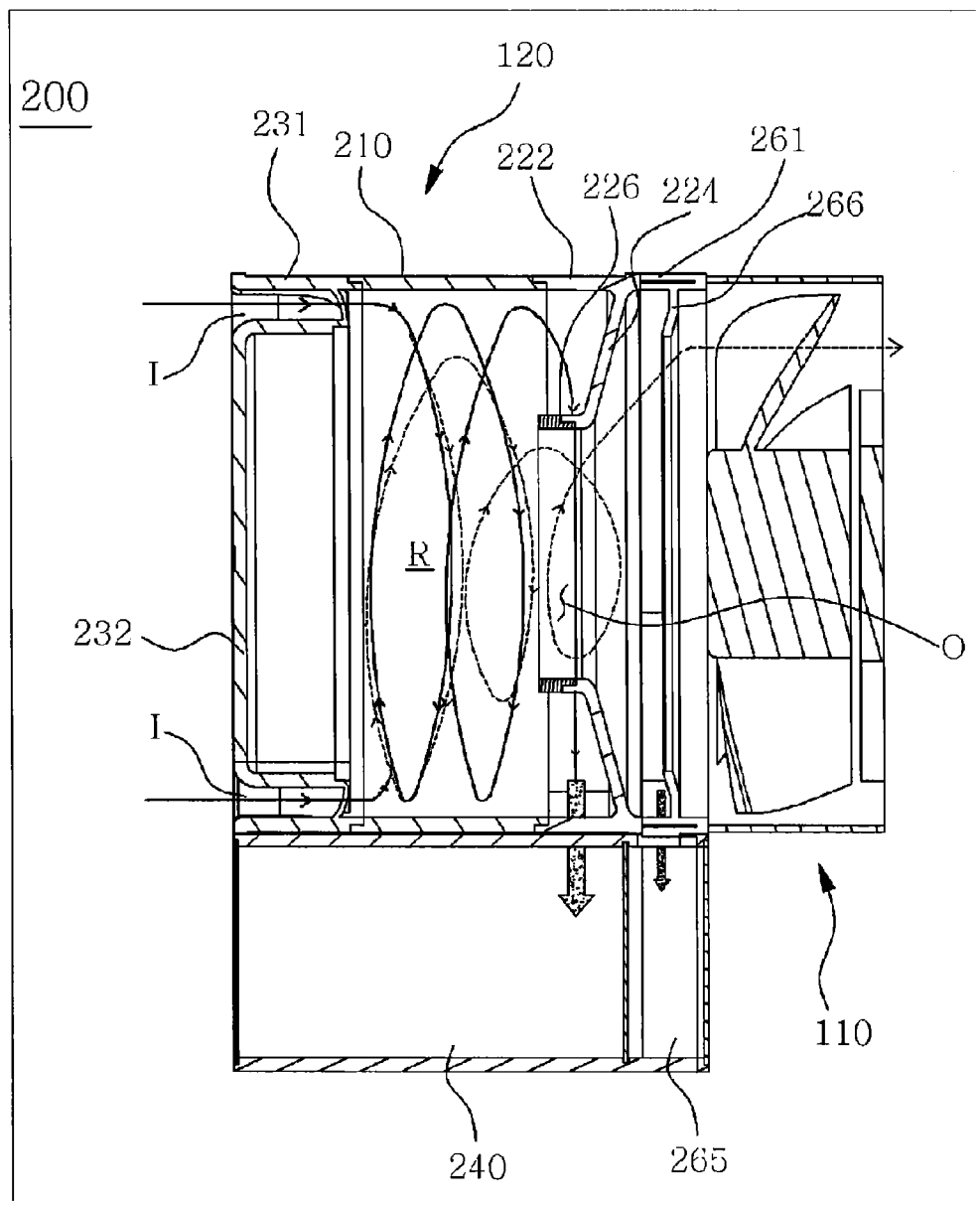
Figure 15:
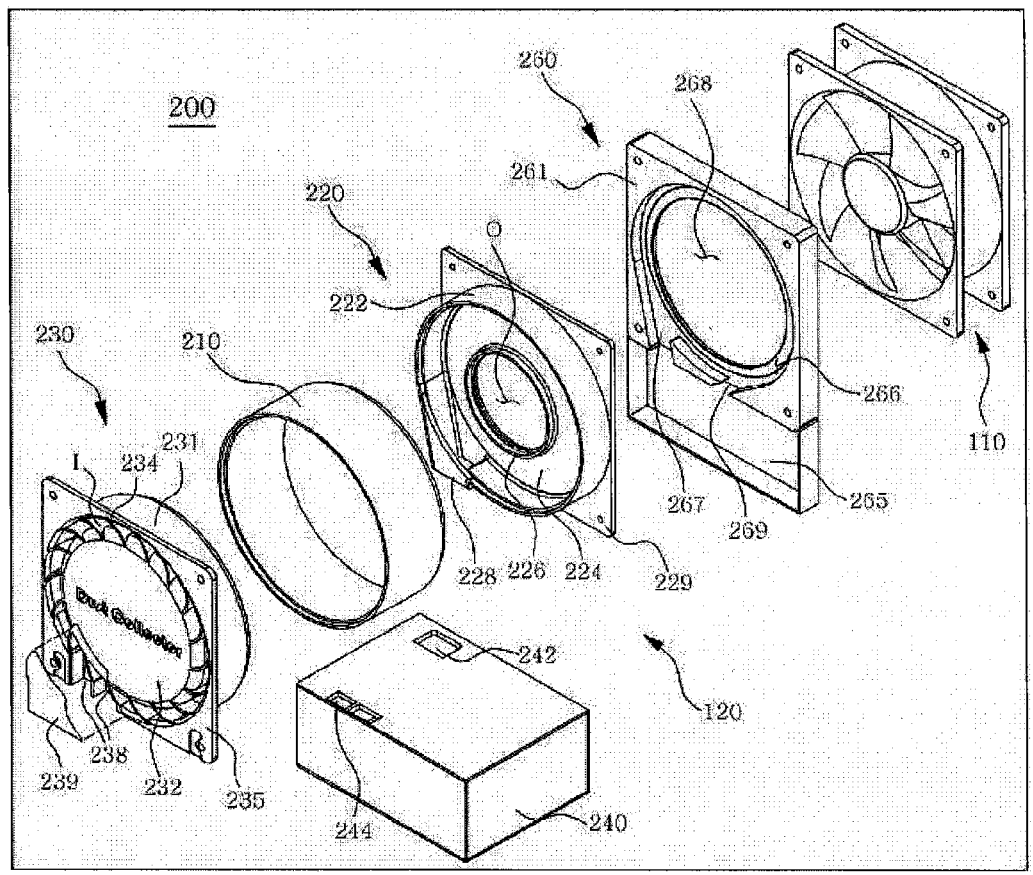

FIGS. 13 to 15 are a perspective view, a cross-sectional view and an exploded perspective view, respectively, showing a fan module 200 according to a second embodiment of the present invention.

The second embodiment of the present invention is the same as the first embodiment in that the fan module 200 includes the fan 110 and the dust-collecting unit 120 combined with the fan 110. The fan module 200 further includes an auxiliary dust-collecting unit 260 combined at the rear end of the dust-collecting unit 120 for eliminating the dust from the air exhausted through the air-discharge port O once more.

Although the dust-collecting unit 120 having a shape different from the first embodiment is shown in figures, the dust-collecting unit 120 may have various shapes. The dust-collecting unit 120 according to the second embodiment may have completely the same function as the dust-collecting unit 120 according to the first embodiment in that the dust is eliminated by using a centrifugal force.

The dust-collecting unit 120 of the fan module 200 according to the second embodiment includes a first housing 210, a guide part 220 combined with the rear end of the first housing 210, a rotation inducing part 230 combined with the front end of the first housing 210 and an auxiliary dust-collecting unit 260 combined with the rear end of the guide part 220. The first housing 210 includes an inner space and the guide part 220 separates and eliminates the dust. A dust-collecting box 240 is disposed under and combined with an assembly of the first housing 210, the guide part 220 and the rotation inducing part 230.

The first housing 210 has a circular pipe shape whose front and rear ends are open and provides the inner space as a rotation region R.

The guide part 220 includes a second housing 222, a guide wall 224, a flange 229 and a guide pipe 226. The second housing 222 has a circular pipe shape having the same inner diameter as the first housing 210. An outer end portion of the guide wall 224 is combined with the second housing 222 without separation and an inner end portion of the guide wall 224 protrudes into an interior of the second housing 222. The flange 229 outwardly protrudes from the rear end of the second housing 222. The guide pipe 226 is disposed at the front end of the guide wall 224 coaxially with the second housing 222.

Since the guide wall 224 and the guide pipe 226 have the same functions as the guide wall 141 and the guide pipe 142, respectively, of the first embodiment, illustrations about the guide wall 224 and the guide pipe 226 will be omitted. A dust-collecting path 228 is communicated with the second housing 222 such that the dust-collecting path 228 is connected to a circumference surface of the second housing 222 substantially along a tangential direction.

Since the dust-collecting path 228 is communicated with a space between the second housing 222 and the guide wall 224, it is preferable that the dust-collecting path 228 is combined with the rear end of the second housing 222. At least, the dust-collecting path 228 is combined with the second housing 222 in back of the front end portion of the guide pipe 226.

The rotation inducing part 230 induces the air flowing into the first housing 210 to spirally rotate. The rotation inducing part 230 includes a third housing 231 of a circular pipe shape having the same inner diameter as the first housing 210, a shielding part 232 of a cap shape disposed in the third housing 231 and a plurality of fixing blades 234 that extend from an outer surface of the shielding part 232 and are connected to an inner surface of the third housing 231. A flange 235 for connection with a case of an electronic equipment or a fan 210 may be formed on the third housing 231.

The shielding part 232 is installed such that an open portion is disposed at the rear end portion. The plurality of fixing blades 234 are connected to the outer surface of the shielding part 232 with a uniform gap distance. As a result, a plurality of air-suction ports I divided by the plurality of fixing blades 234 are disposed at the periphery of the shielding part 232 along a circumferential direction with a uniform gap distance.

Each of the plurality of fixing blades 234 induces the inputted air to spirally rotate in the first housing 210. As a result, a vector of the output direction of each air-suction port I includes components of a longitudinal direction and a tangential direction of the first housing 210 or the third housing 231.

A feedback path 238 for exhausting a portion of the air in the dust-collecting box 240 into the first housing 210 is combined with the sidewall of the third housing 231. One end of the feedback path 238 communicates with a feedback hole 244 of the dust-collecting box 240 and the other end of the feedback path 238 communicates with a space between the third housing and the shielding part 232.

In the second embodiment of the present invention, a covering plate 239 covering at least one air-suction port I is combined with the front end surface of the rotation inducing part 230, and the feedback path 238 is formed in the inner space of the at least one air-suction port I covered by the covering plate 239.

The feedback path 238 may not be connected to the third housing but may be connected to the first housing 210. When the feedback path 238 is connected to the first housing 210, it is preferable that the feedback path 238 is connected to the front end portion of the first housing 210 to prevent scattering of the dust rotating in the rotation region R due to the feedback air.

It is preferable that the rear end of the rotation inducing part 230 and the front end of the guide part 220 are disposed to be spaced apart from each other along the longitudinal direction. As shown in FIG. 14, when the rear end of the rotation inducing part 230 and the front end of the guide part 220 are separated from each other, the clean air flowing through the air-suction port I is naturally exhausted through the air-discharge port O. In addition, the relatively heavy dust rotates along the inner wall of the second housing 222 by a centrifugal force and is collected in the dust-collecting box 240 through the dust-collecting path 228.

The dust-collecting box 240 includes a dust-collecting hole 242 and the feedback hole 244 communicating with the dust-collecting path 228 and the feedback path 238, respectively.

Although it is preferable that the first, second and third housings 210, 222 and 231 have the same inner diameters as one another, a diameter of each of the first, second and third housings 210, 222 and 231 may gradually increase along a direction from the front end to the rear end.

The second housing 222 is combined with the rear end of the first housing 210 without separation, and the third housing 231 is combined with the front end of the first housing 210 without separation. It is preferable that the first, second and third housings 210, 222 and 231 are disposed coaxially with one another along an air-flowing path.

As shown in figures, the first housing 210, the guide part 220 and the rotation inducing part 230 may be individually fabricated and may be assembled. Alternatively, the first housing 210, the guide part 220 and the rotation inducing part 230 may be fabricated as a single body.

In addition, after the first, second and third housings 210, 222 and 231 are fabricated as a single circular pipe, the shielding part 232 and the fixing blades 234 may be formed on the front end of the single circular pipe to constitute the plurality of air-suction ports I and the guide wall 224 may be combined with the rear end of the single circular pipe. As necessary, different methods may be applied to fabrication and assembly.

The auxiliary dust-collecting unit 260 eliminates the dust by circulating the exhausted air once more on the basis that the air exhausted from the air-discharge port O of the guide part 220 still spirally rotates.

The auxiliary dust-collecting unit 260 includes a body 261, an auxiliary rotation path 266, an auxiliary dust-collecting box 265, the dust-collecting path 267 and the feedback path 269. The body includes a penetration portion of a circular shape, and the auxiliary rotation path 266 is formed on a side surface of the front end of the body 261 at a periphery of the penetration portion 268 along a circumferential direction. The auxiliary dust-collecting box 265 is separated from the auxiliary dust-collecting path 266, and the auxiliary dust-collecting path 267 and the feedback path 269 connect the auxiliary rotation path 266 and the auxiliary dust-collecting box 265.

Figure 16:
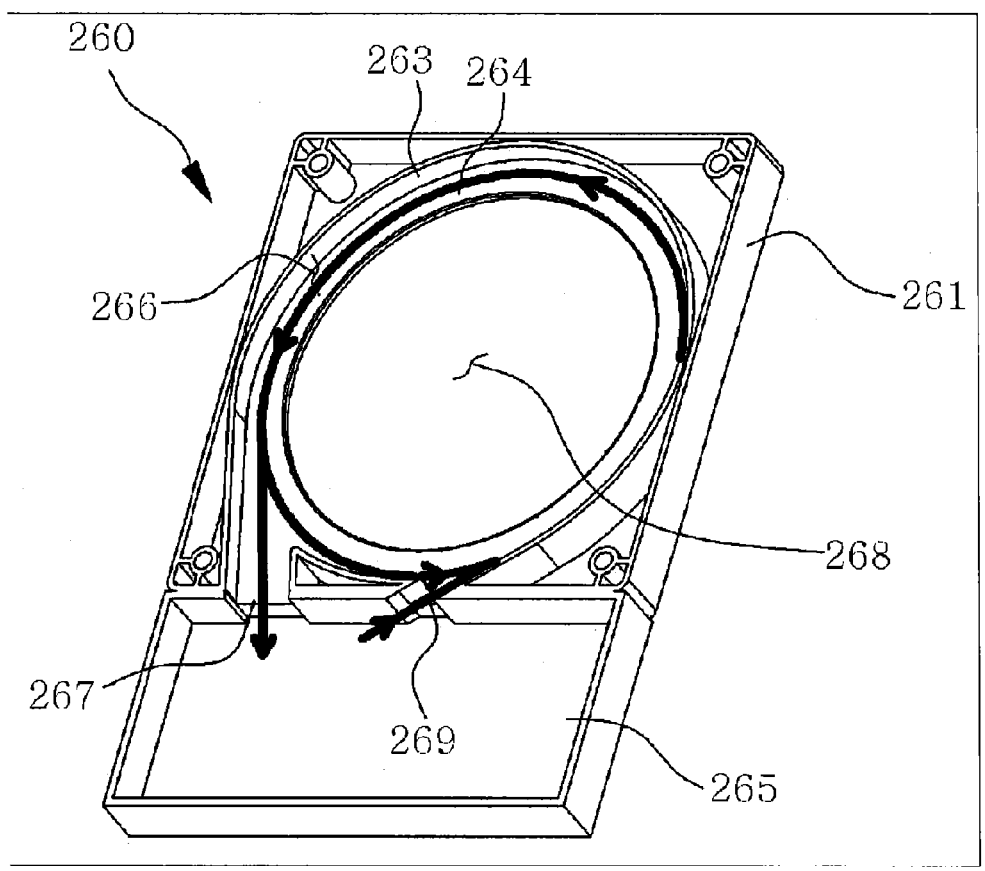
FIG. 16 is a perspective view showing an auxiliary dust-collecting unit.

As shown in FIG. 16, the auxiliary dust-collecting unit 260 may further include a fourth housing 283 of a short circular pipe shape and an auxiliary guide wall 264 extending from the rear end of the fourth housing 263 to a central axis thereof. The penetration portion 268 is formed at a center of the auxiliary guide wall 264. A space between the fourth housing 263 and the auxiliary guide wall 264 is provided as the auxiliary rotation path 266.

It is preferable that the fourth housing 263 has the same inner diameter as the second housing 222 of the dust-collecting unit 120. In addition, it is preferable that a central axis of the fourth housing 263 is coincident with a central axis of each of the first, second and third housings 210, 222 and 231. Further, it is preferable that a center of the penetration portion 268 is disposed on the axis of the fourth housing 263.

The auxiliary dust-collecting path 267 communicating with the inner space of the auxiliary dust-collecting box 265 is connected to the fourth housing 263 along the tangential direction, and the auxiliary feedback path 269 exhausting the clean air in the auxiliary dust-collecting box 265 is also connected to the fourth housing along the tangential direction.

For the purpose of effectively collecting the dust flowing into the auxiliary rotation path 266, it is preferable that the auxiliary rotation path 266 has a concave cross-section and an inner edge of the auxiliary guide wall 264 is bent toward the front end portion with a predetermined angle. However, since the dust flowing into the fourth housing 263 rotates along the inner wall of the fourth housing 263 by a centrifugal force, the dust-collecting effect is obtained even when the inner edge of the auxiliary guide wall 264 is not bent.

As shown in figures, the auxiliary dust-collecting box 265 may be fabricated such that the side surface of the front end portion is open. Alternatively, the auxiliary dust-collecting box 265 may be fabricated such that the side surface of the front end portion is closed. When the side surface of the front end portion is open, the auxiliary dust-collecting box 265 is assembled such that the open side surface is closed by the side surface of the dust-collecting box 240.

The single auxiliary dust-collecting unit 260 may be installed or at least two auxiliary dust-collecting units 260 may be continuously installed. In addition, the auxiliary dust-collecting box 265 may be installed to be separable from the body 261 for eliminating the collected dust. Alternatively, a door (not shown) for eliminating the dust may be individually formed on the auxiliary dust-collecting box 265.

In addition, the auxiliary dust-collecting box 265 and the body 261 may be formed as a single body. Alternatively, the auxiliary dust-collecting box 265 and the dust-collecting box 240 may be formed as a single body, or the auxiliary dust-collecting box 265 may be combined with a side surface of the dust-collecting box 240. When the auxiliary dust-collecting box 265 and the dust-collecting box 240 are formed as a single body, holes communicating with the dust-collecting path 267 and the feedback path 269 of the auxiliary dust-collecting unit 260, respectively, may be further formed on the dust-collecting box 240. For the purpose of preventing exhaust of the collected dust of the dust-collecting box 240 through the feedback path 269, it is preferable that a space where the dust is collected through the dust-collecting path 228 of the guide part 220 is separated from a space where the dust is collected through the dust-collecting path 267 of the auxiliary dust-collecting unit 260 by using a sidewall (not shown).

The fan module 200 according to a second embodiment of the present invention may be installed on a case C of an electronic equipment in various types similarly to the first embodiment.

Operation of the fan module 200 according to a second embodiment of the present invention will be illustrated with reference to FIGS. 13 to 15 hereinafter. In FIG. 14, the solid line represents a flowing path of dust and the dotted line represents a flowing path of clean air.

When the fan 110 starts operating, the exterior air flows into the dust-collecting unit 120. After the exterior air passes through the air-suction port I of the rotation inducing part 230, the exterior air spirally rotates and flows into the first housing 210. The exterior air is exhausted through the air-discharge port O of the guide part 220.

The dust in the air rotates along the inner wall of the first housing 210 by a centrifugal force and advances along the longitudinal direction. The dust rotates along the inner wall of the second housing 222 of the guide part 220 and is finally collected in the dust-collecting box 240 through the dust-collecting path 228.

A portion of the air flowing into the dust-collecting box 240 return to the rotation inducing part 230, i.e., a space formed by the covering plate 239 and the fixing blades 234 through the feedback path 238 and then the portion of the air flows into the first housing 210 again.

Since the air exhausted from the air-discharge port O of the guide part 220 still spirally rotates, the air is rapidly diffused along the rear end surface of the guide wall 224 even as the air is exhausted from the air-discharge port O.

The clean air is exhausted through the penetration portion 268 of the auxiliary dust-collecting unit 260, and the dust in the air rotates along the inner side surface of the fourth housing 263 in the auxiliary rotation path 266 of the auxiliary dust-collecting unit 260 by a centrifugal force and is collected in the auxiliary dust-collecting box 265 through the auxiliary dust-collecting path 267. The air flowing into the auxiliary dust-collecting box 265 is exhausted to the auxiliary rotation path 266 again through the feedback path 269 and then is exhausted to the fan 110 through the penetration portion 268.

Figure 17:
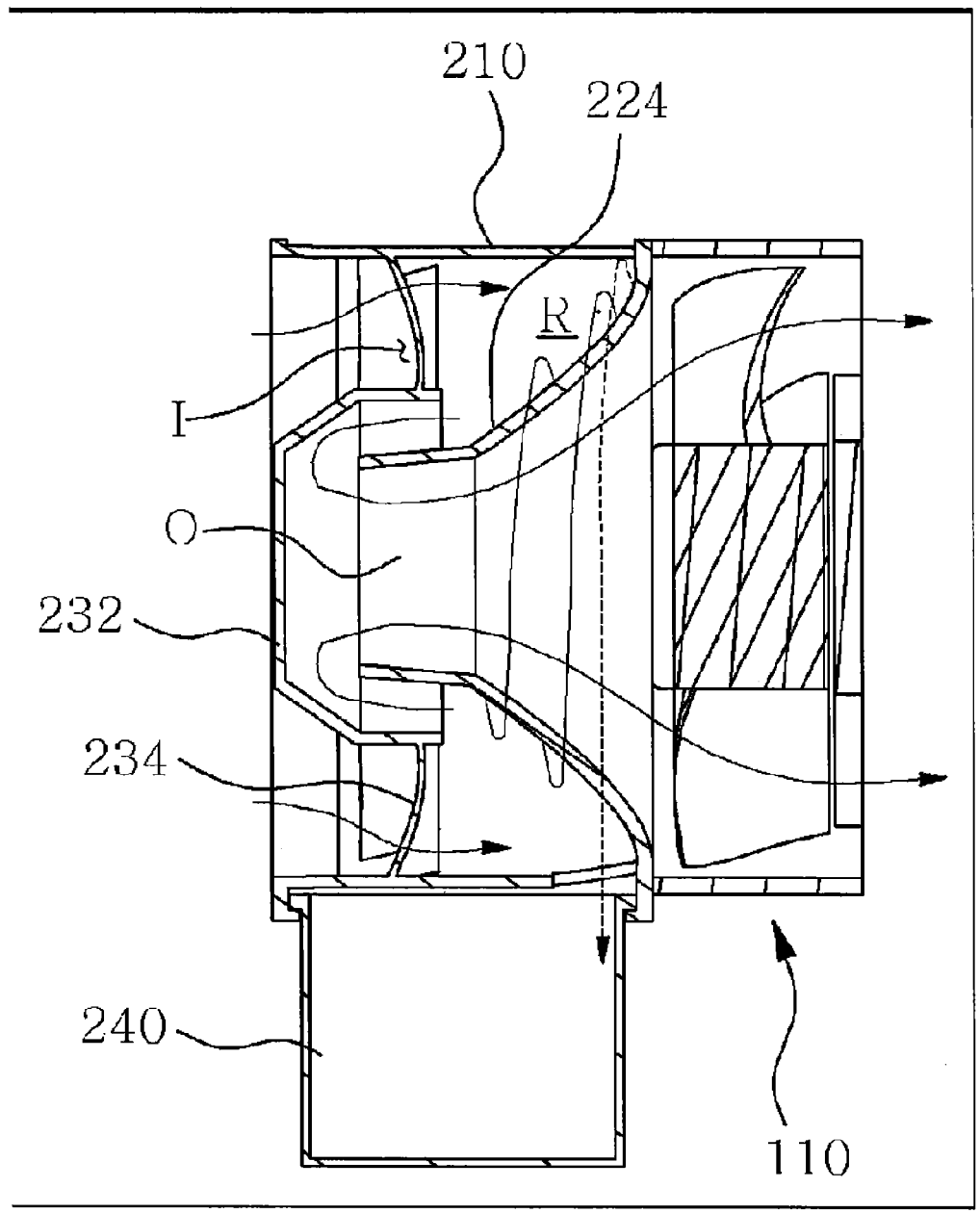
FIG. 17 is a cross-sectional view showing a dust-collecting unit according to a modified embodiment.

In the above-mentioned embodiments, the dust-collecting unit 120 of the fan module 100 and 200 may be designed to have various types. For example, as shown in FIG. 17, the front end of the guide wall 224 in the housing 210 may be inserted into the shielding part 232 of the rotation inducing part.

Although the fan module 100 and 200 of the present invention is used for eliminating dust flowing into a case of an electronic equipment such as a computer, an automatic teller machine (ATM), a set-top box, a display device, a medical device, an industrial computer, a communication device or the like or a household appliance such as a television, an audio system, a refrigerator, an air conditioner or the like, the usage of the fan module 100 and 200 is not restricted.

Accordingly, the fan module 100 and 200 may be installed in the middle of an air-flowing path to eliminate dust in air.

Figure 18:
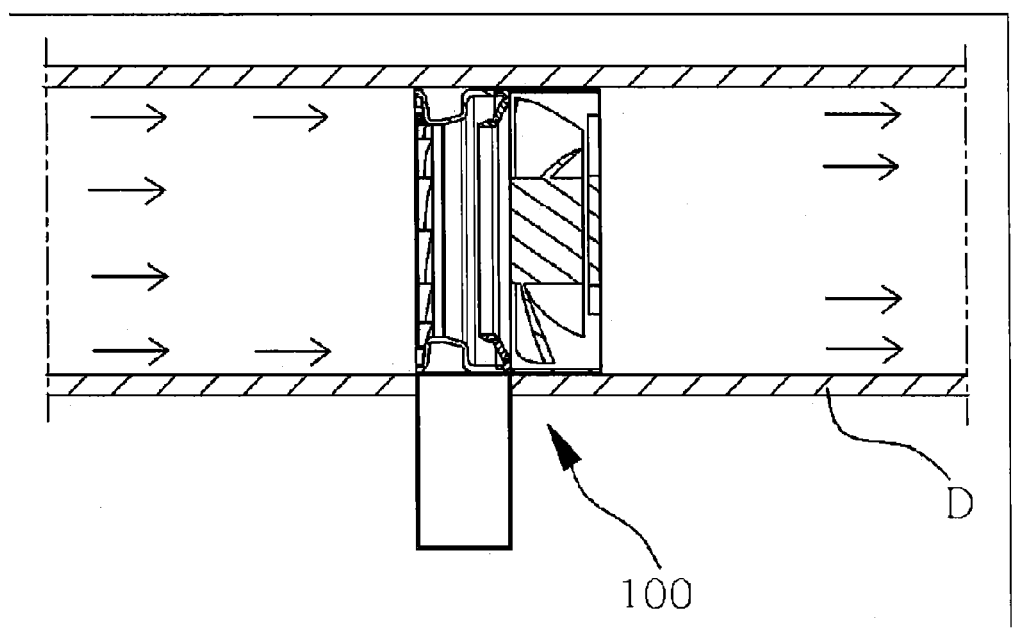
FIGS. 18 and 19 are views showing a fan module in a duct and on a window of wall, respectively, according to a first embodiment of the present invention
Figure 19:
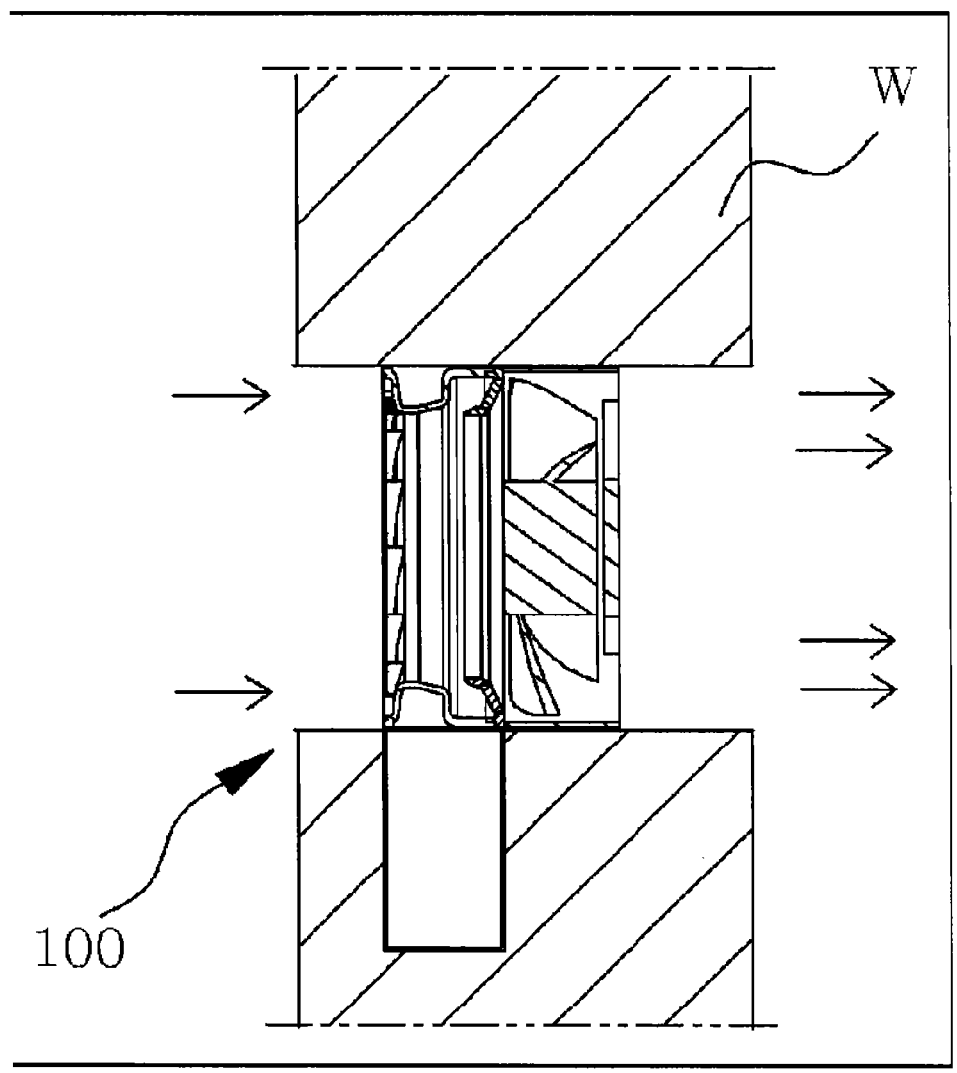

For example, the fan module 100 may be installed in the middle of a duct D of a ventilation system as shown in FIG. 18, and the fan module 100 may be installed on a window of a wall W instead of a ventilator. The fan module 100 may be used for preventing inflow of exterior dust and may be used for preventing pollution of environment by eliminating dust in exhausted air.

In addition, the fan module of the present invention may be used instead of a cooler for radiating heat of a central processing unit (CPU) of an electronic equipment. In the present disclosure, the CPU represents one of a CPU on a main board, a GPU on a graphic card and a semiconductor device for controlling operation of various modules.

In general, a CPU cooler includes a heat radiating block that contacts the CPU and absorbs heat of the CPU, a plurality of heat radiating fins that are connected to the heat radiating block and emit heat of the heat radiating block to exterior and a cooling fan that is installed at a side of the heat radiating fins. As the electronic equipment is used for a long time, dust flowing through the cooling fan is accumulated in a gap between the heat radiating fins and cooling efficiency is reduced. As a result, performance of the CPU is seriously deteriorated. The deterioration in performance of the CPU due to dust is prevented by installing the fan module of the present invention instead of the cooling fan of the prior art.

In addition, dust flowing into a fan of an air blowing device such as an electric fan may be eliminated in advance by combining a dust-collecting unit with the fan of the air blowing device. For example, inputted dust may be eliminated by installing a case to surround a rear portion of a fan of an electric fan and by installing a dust-collecting unit of the present on the case.

Further, the dust-collecting unit 120 itself constituting the fan module 100 and 200 of the present invention may be used as an independent dust-collecting device. When the dust-collecting unit is used in a circumstance having a sufficient air flux or a sufficient suction force, dust may be eliminated by the dust-collecting unit without a fan 110.

Although embodiments of the present invention are illustrated, the present invention is not limited to the embodiments described herein, and various modifications and variations can be made in the present invention. In addition, it will be apparent that the present invention covers the modifications and variations of this invention provided they come within the scope of the appended claims and their equivalents.

The invention claimed is:

1. A fan module installed on a case of an electronic equipment or a household appliance and inputting an air into the case, comprising:
  a dust-collecting unit having a rotation region, at least one air-suction port and at least one air-discharge port, the at least one air-suction port and the at least one air-discharge port communicating with the rotation region; and
  a fan combined with the dust-collecting unit and inputting the air into the rotation region,
  wherein the dust-collecting unit comprises:
  a housing having the rotation region therein and open portions at a front end and a rear end thereof, the open portions communicating with the rotation region;
  a rotation inducing part combined with a front end of the rotation region and inducing the air to spirally rotate, the rotation inducing part including the at least one air-suction port;
  a guide wall combined with the housing without separation at a rear end of the rotation region and protruding toward a central axis along a longitudinal direction of the rotation region, the guide wall surrounding the at least one air-discharge port disposed coaxially with the central axis of the rotation region; and
  a dust-collecting box combined with the housing and collecting a dust rotating in the rotation region through one of a dust-collecting path connected to the housing and a dust-collecting hole formed on the housing.

2. The fan module according to claim 1, wherein the fan includes an axial fan generating an air flow along a rotating shaft thereof, and the central axis of the rotation region is disposed coaxially with the rotating shaft of the fan.

3. The fan module according to claim 1, wherein the guide wall is disposed perpendicular to the central axis of the rotation region.

4. The fan module according to claim 1, wherein a rear end portion of the guide wall is combined with the housing without separation, and a front end of the guide wall is disposed in the rotation region.

5. The fan module according to claim 1, wherein a guide pipe of a circular pipe shape is combined with a periphery of the guide wall surrounding the at least one air-discharge port and extends to the front end of the rotation region, and the guide pipe is disposed coaxially with the central axis of the rotation region.

6. The fan module according to claim 1, wherein the rotation region includes a first rotation region and a second rotation region that is disposed in back of the first rotation region and has a diameter greater than the first rotation region.

7. The fan module according to claim 6, wherein first and second regions have a discontinuous surface.

8. The fan module according to claim 6, wherein a rear end portion of the guide wall is combined with an inner wall of the housing without separation and a front end portion of the guide wall is disposed in the second rotation region, and an outer diameter of the front end portion of the guide wall is smaller than an inner diameter of the first rotation region.

9. The fan module according to claim 1, wherein the rotation inducing part comprises:
  a shielding part of a cap shape having an open end and a closed end, the closed end disposed to face an interior of the housing; and
  a plurality of fixing blades combined between an outer side surface of the shielding part and the housing and slanting with a predetermined angle,
  wherein a space between the adjacent fixing blades is provided as the at least one air-suction port.

10. The fan module according to claim 1, wherein a flange outwardly protruding from a circumference of the open portion at the front end of the housing,
  wherein the rotation inducing part comprises:
  at least one guide groove on a front end surface of the flange, an inner end portion of the at least one guide groove communicating with the rotation region of the housing; and
  a shielding plate combined with the front end of the housing and covering the open portion of the housing and a portion of the at least one guide groove, and
  wherein a space between the shielding plate and the at least one guide groove is provided as the at least one air-suction port.

11. The fan module according to claim 1, wherein the housing has a circular pipe shape, wherein the rotation inducing part includes a shielding plate covering the open portion at the front end of the housing and a penetration opening on a side surface of the housing, and wherein the penetration opening is provided as the at least one air-suction port.

12. The fan module according to claim 1, wherein a side surface of the housing includes one of a feedback path communicating with the dust-collecting box and the rotation region and a feedback hole.

13. The fan module according to claim 1, further comprising an auxiliary dust-collecting unit combined with a rear end of the dust-collecting unit,
  wherein the auxiliary dust-collecting unit comprises:
  a body including a penetration portion communicating with the rotation region of the housing and an auxiliary rotation path at a periphery of the penetration portion;

an auxiliary dust-collecting box separated from the auxiliary rotation path; and an auxiliary dust-collecting path connecting the auxiliary dust-collecting box and the auxiliary rotation path for collecting the dust rotating in the auxiliary rotation path.

14. The fan module according to claim 13, further comprising an auxiliary feedback path connecting the auxiliary dust-collecting box and the auxiliary rotation path for exhausting the air of the auxiliary dust-collecting box into the rotation region.

15. A dust-collecting unit installed on a case of an electronic equipment or a household appliance surrounding an inner space and eliminating a dust from an air flowing into the inner space, comprising:
- a housing having a rotation region therein and open portions at a front end and a rear end thereof, a side surface of the housing including one of a dust-collecting path and a dust-collecting hole;
- a dust-collecting box combined with the housing and communicating with one of the dust-collecting path and the dust-collecting hole;
- a guide wall combined with the housing without separation at a rear end of the rotation region and protruding toward a central axis along a longitudinal direction of the rotation region, the guide wall surrounding an air-discharge port disposed coaxially with the central axis of the rotation region; and
- a rotation inducing part combined with a front end of the rotation region and inducing the air to spirally rotate, the rotation inducing part including at least one air-suction port.

16. The dust-collecting unit according to claim 15, wherein the rotation region includes a first rotation region and a second rotation region that is disposed in back of the first rotation region and has a diameter greater than the first rotation region.

17. The dust-collecting unit according to claim 16, wherein a rear end portion of the guide wall is combined with an inner wall of the housing without separation and a front end portion of the guide wall is disposed in the second rotation region, and an outer diameter of the front end portion of the guide wall is smaller than an inner diameter of the first rotation region.

18. A cooling means, comprising:
- a heat radiating block that is combined with a central processing unit and receiving a heat of the central processing unit;
- a heat radiating fin that is connected to the heat radiating block and exhausts the heat of the heat radiating block to an exterior; and
- a fan module combined with the heat radiating fin, wherein the fan module comprises:
- a dust-collecting unit having a rotation region, at least one air-suction port and at least one air-discharge port, the at least one air-suction port and the at least one air-discharge port communicating with the rotation region; and
- a fan combined with the dust-collecting unit and inputting the air into the rotation region, and wherein the dust-collecting unit comprises:
- a housing having the rotation region therein and open portions at a front end and a rear end thereof, the open portions communicating with the rotation region;
- a rotation inducing part combined with a front end of the rotation region and inducing the air to spirally rotate, the rotation inducing part including the at least one air-suction port;
- a guide wall combined with the housing without separation at a rear end of the rotation region and protruding toward a central axis along a longitudinal direction of the rotation region, the guide wall surrounding the at least one air-discharge port disposed coaxially with the central axis of the rotation region; and
- a dust-collecting box combined with the housing and collecting a dust rotating in the rotation region through one of a dust-collecting path connected to the housing and a dust-collecting hole formed on the housing.

\* \* \* \* \*